US008233753B2

(12) United States Patent
Iwanami et al.

(10) Patent No.: US 8,233,753 B2
(45) Date of Patent: Jul. 31, 2012

(54) ELECTRIC FIELD SENSOR, MAGNETIC FIELD SENSOR, ELECTROMAGNETIC FIELD SENSOR AND ELECTROMAGNETIC FIELD MEASURING SYSTEM USING THESE SENSORS

(75) Inventors: Mizuki Iwanami, Tokyo (JP); Masafumi Nakada, Tokyo (JP); Norio Masuda, Tokyo (JP); Keishi Ohashi, Tokyo (JP)

(73) Assignee: NEC Corporation, Tokyo (JP)

( * ) Notice: Subject to any disclaimer, the term of this patent is extended or adjusted under 35 U.S.C. 154(b) by 1248 days.

(21) Appl. No.: 11/917,537

(22) PCT Filed: Jun. 23, 2006

(86) PCT No.: PCT/JP2006/312614
§ 371 (c)(1),
(2), (4) Date: Dec. 14, 2007

(87) PCT Pub. No.: WO2007/000947
PCT Pub. Date: Jan. 4, 2007

(65) Prior Publication Data
US 2009/0234619 A1    Sep. 17, 2009

(30) Foreign Application Priority Data
Jun. 29, 2005 (JP) .................................. 2005-189260

(51) Int. Cl.
*G02B 6/00* (2006.01)
*G02B 6/26* (2006.01)
*G02F 1/035* (2006.01)
*G02F 1/295* (2006.01)

(52) U.S. Cl. ......... 385/12; 385/2; 385/3; 385/8; 385/38; 385/43

(58) Field of Classification Search .................. 385/6, 8, 385/11, 12, 2, 3, 38, 43
See application file for complete search history.

(56) References Cited

U.S. PATENT DOCUMENTS
4,144,361 A * 3/1979 Feldstein ..................... 427/162
(Continued)

FOREIGN PATENT DOCUMENTS
JP          56-157872 A     12/1981
(Continued)

OTHER PUBLICATIONS
S. Wakana et al., "Novel Electromagnetic Field Probe Using Electro/Magneto-Optical Crystal Mounted on Optical-Fiber Facet for Microwave Circuit Diagnosis", 2000 IEEE MTT-S International Microwave Symposium Digest, XP-000967537, vol. 3, Jun. 11, 2000, pp. 1615-1618.*

(Continued)

*Primary Examiner* — Brian M. Healy
*Assistant Examiner* — Hung Lam
(74) *Attorney, Agent, or Firm* — Sughrue Mion, PLLC

(57) ABSTRACT

An electric field sensor or a magnetic field sensor includes an optical fiber and an electro-optic layer or a magneto-optic layer. The electro-optic layer or a magneto-optic layer is provided on an end surface of an end portion of the optical fiber. The end surface of the optical fiber is a convex shape. The optical fiber may have the end portion with a shape of a substantial cone formed by extending the end portion, and the electro-optic layer or the magneto-optic layer may be formed on a side surface of a front end of the substantial cone. A dielectric layer may be further included between the optic layer and the end surface.

19 Claims, 15 Drawing Sheets

U.S. PATENT DOCUMENTS

| | | | |
|---|---|---|---|
| 4,533,829 A * | 8/1985 | Miceli et al. | 250/227.27 |
| 5,060,307 A * | 10/1991 | El-Sherif | 398/200 |
| 5,488,677 A * | 1/1996 | Tokano | 385/3 |
| 6,223,066 B1 * | 4/2001 | Govari | 600/424 |
| 2001/0054681 A1 * | 12/2001 | Hamada | 250/227.11 |
| 2004/0246489 A1 * | 12/2004 | Kinugasa et al. | 356/477 |
| 2005/0098103 A1 * | 5/2005 | Miyoshi | 118/712 |
| 2005/0190358 A1 * | 9/2005 | Iwanami et al. | 356/73.1 |

FOREIGN PATENT DOCUMENTS

| | | |
|---|---|---|
| JP | 59-145977 A | 8/1984 |
| JP | 60-263866 A | 12/1985 |
| JP | 2-186282 A | 7/1990 |
| JP | 2-291984 A | 12/1990 |
| JP | 6-82488 A | 3/1994 |
| JP | 7-104013 A | 4/1995 |
| JP | 7-120504 A | 5/1995 |
| JP | 7-244086 A | 9/1995 |
| JP | 11-67061 A | 3/1999 |
| JP | 2000-162566 A | 6/2000 |
| JP | 2001-281470 A | 10/2001 |

OTHER PUBLICATIONS

T. Ohara, et al, "Two-Dimensional Field Mapping of Microstrip Lines with a band Pass Filter or a Photonic Bandgap Structure by Fiber-Optic EO Spectrum Analysis System", Proc. Int. Topical Meeting Microwave Photonics, Oxford, U.K., Sep. 2000, pp. 210-213.

S. Wakana, et al, "Fiber-Edge Electrooptic/Magnetooptic Probe for Spectral-Domain Analysis of Electromagnetic Field", IEEE Trans. Microwave Theory Tech., vol. 48, No. 12, Dec. 2000, pp. 2611-2616.

E. Yamazaki, et al, "Three-Dimensional Magneto-Optic Near-Field Mapping over 10-50 μm-Scale Line and Space Circuit Patterns", Proc. The 14th Annual Meeting of the IEEE Lasers & Electro-Optics Society, Nov. 2001, p. 318.

E. Yamazaki, et al. "High-Frequency Magneto-Probe Based on BiRIG Rotation Magnetization", IEICE Trans. Electron., vol. E86-C, No. 7, Jul. 2003, pp. 1338-1344.

M. Iwanami. et al, "Wideband Magnetooptic Probe with 10 μm-Class Spatial Resolution", Japanese Journal of Applied Physics, vol. 43, No. 4B, Apr. 2004, pp. 2288-2292.

* cited by examiner

ELECTRIC FIELD SENSOR, MAGNETIC FIELD SENSOR, ELECTROMAGNETIC FIELD SENSOR AND ELECTROMAGNETIC FIELD MEASURING SYSTEM USING THESE SENSORS

TECHNICAL FIELD

The present invention relates to an electric field sensor, a magnetic field sensor, an electromagnetic field sensor and an electromagnetic field measuring system using these sensors, in particular, an electric field sensor, a magnetic field sensor, an electromagnetic field sensor and an electromagnetic field measuring system using these sensors, which are used for measurement in a micro region.

BACKGROUND ART

An electromagnetic field sensor for measuring electromagnetic field of a micro region and an electromagnetic field measuring system using the sensor are well-known. FIG. 1A is a block diagram showing an example of a conventional electric field measuring system. FIG. 1B is a sectional view showing an electric field sensor used in the electric field measuring system. The electric field measuring system 820 includes, as shown in FIG. 1A, an optical fiber 801, a continuous laser beam source 800, a fiber amplifier 802, a polarization controller 803, an optical circulator 804, an electric field sensor 805, an analyzer 806, a fiber amplifier 807, a photo detector 808 and a spectrum analyzer 809. The electric field sensor 805 includes, as shown in FIG. 1B, the optical fiber 801, an electro-optic crystal 812 and a dielectric multilayer reflective layer 813. The electro-optic crystal 812 is a minute electric detecting element adhered to a front end of the optical fiber 801 via an adhesive layer 811. The dielectric multilayer reflective layer 813 is provided on a bottom surface of the electro-optic crystal 812 and reflects light.

Electric field detecting principles of the electric field measuring system 820 will be schematically described below. The continuous laser beam source 800 emits a laser beam. The fiber amplifier 802 amplifies the laser beam. The polarization controller 803 controls a polarization plane of the laser beam. The optical circulator 804 emits the laser beam to the electric field sensor 805. The dielectric multilayer reflective layer 813 provided on a bottom surface of the electro-optic crystal 812 reflects the laser beam. At this time, the refraction index of the electro-optic crystal 812 changes depending on an electric field generated from a circuit board 810. With such change, the polarization state of the laser beam propagating in the crystal is modulated based on an intensity of the external electric field. The optical circulator 804 returns the modulated and reflected laser beam to the optical fiber 801. The analyzer 806 converts the laser beam into intensity modulated light. The fiber amplifier 807 amplifies the converted laser beam. The photo detector 808 converts the amplified laser beam into an electric signal. The spectrum analyzer 809 detects the electric signal. A peak of the electric signal detected by the spectrum analyzer 809 corresponds to a signal caused by the external electric field. According to the principles of this system, signal intensity varies depending on the intensity of the external electric field. Thus, electric field distribution can be obtained by changing location of the electric field sensor 805 on the circuit board 810.

When the electro-optic crystal 812 in FIG. 1B is changed to a magneto-optic crystal, FIG. 1A shows a conventional magnetic field measuring system. Magnetic field detecting principles in this case are explained by changing electric field in the description of the above-mentioned electric field detecting principles to magnetic field.

The conventional electric field measuring system or the magnetic field measuring system employs an electric field sensor or a magnetic field sensor which is attached to the front end of the optical fiber. The electric field sensor or the magnetic field sensor has a configuration in which the electro-optic crystal 812 or the magneto-optic crystal produced by a micro-fabrication technique is adhered to the front end of the optical fiber. An applicable area and spatial resolution of the sensor are limited by a size of the crystal. That is, as the size of the crystal is smaller, the applicable area becomes smaller and the spatial resolution becomes higher. The spatial resolution is determined by the volume of the sensor beam propagating in the crystal. As the volume of the sensor beam is smaller, the spatial resolution becomes higher. For example, the conventional magnetic field sensor with the magneto-optic crystal adhered to a front end of the optical fiber can realize the spatial resolution of about 10 μm by using a crystal having 270 μm×270 μm in a plane size and 11 μm in thickness. With such configuration, however, further smaller sensor having higher spatial resolution cannot be realized due to limitation in a crystal micro-fabrication technique. In other words, a sensor applicable to a micro region of an LSI chip/package cannot be provided.

As described above, the conventional electromagnetic field sensor has the microfabricated crystal on the front end of the optical fiber. Generally, a plane size of a crystal is larger than a sectional area of a fiber. For this reason, it is difficult to tie a plurality of electromagnetic field sensors in a bundle. It is also difficult to prepare a plurality of crystals having the same thickness. Furthermore, it is difficult to prepare a plurality of sensors each having an adhesive layer of the same thickness which contributes to energy loss. For these reasons, it is impossible to constitute an electromagnetic field measuring system by tying a plurality of electromagnetic field sensors of the same spatial resolution and sensitivity. For these reasons, two-dimensional information cannot be measured without scanning sensors. The sensitivity of the magnetic field measuring system cannot be improved by signal processing between a plurality of sensors.

As techniques related to the above description, Japanese Laid-Open Patent Application JP-A-Heisei, 07-104013 discloses a probe. The probe includes glass blocks, a glass plate, a transparent electrode, electric-optic converting elements, dielectric multilayer reflective films, an electric wire, optical fibers, a fiber fixing part and a clamp part. The glass block has a front end part formed by cutting off a top of a pyramid-like quartz glass with a plane parallel to a bottom surface. The glass plate holds the plurality of the glass blocks in a line on the same plane. The transparent electrode is deposited simultaneously on a slant surface and a cut surface of each of the plurality of the aligned glass blocks. The electric-optic converting element is adhered to the front end of the glass block. The dielectric multilayer reflective film is placed on the electric-optic converting element and located on the surface opposite to the surface adhered to the glass block to reflect a laser beam. The electric wire is drawn from the transparent electrode. The optical fiber is located on the glass plate and guides the laser beam to the electric-optic converting element. The fiber fixing part fixes the optical fibers onto the glass plate. The clamp part clamps the fixing part and a surface of an object to be inspected which is opposite to an inspected surface.

Japanese Laid-Open Patent Application JP-A-Heisei, 06-82488 discloses a sensor for a light transformer. In the sensor for the light transformer, a Faraday element is disposed between a polarizer and an analyzer, and first and second fiber bundles composed of a plurality of optical fiber groups are provided on a light incidence side of the polarizer and on a light exit side of the analyzer, respectively. In the sensor for the light transformer, an end surface of the first fiber bundle directed toward a surface of the Faraday element is polished into a projecting spherical surface, and a dielectric film is formed on a surface of the polished portion so as to form the polarizer.

Japanese Laid-Open Patent Application JP-A-Heisei, 07-120504 discloses a voltage measuring apparatus. The voltage measuring apparatus has a laser beam source, an electro-optic member, reflecting means and detecting means. The laser beam source has first and second emitting end faces. The electro-optic member has a curved face with a high reflection coat formed on a surface thereof. A face opposite to the curved face is bonded to the first emitting end face of the laser beam source so that a center point of curvature of the curved face and a light emitting point on the first emitting end face of the laser beam source coincide with each other. The refraction index to the light varies depending on the electric field. The reflecting means is provided on the second emitting end face of the laser beam source. The detecting means detects a light intensity of the laser beam which penetrates through the reflecting means and emitted.

Japanese Laid-Open Patent Application JP-A-Showa, 59-145977 discloses a technique of a magnetic field measuring device. The magnetic field measuring device has a detecting part, an optical fiber and a measuring part. The detecting part attaches a polarizer and a Faraday rotary element on an end part or in the middle of the optical fiber. The optical fiber sends light to the detecting part and transfers the light from the detecting part. The measuring part connects the optical fiber to a light source and measures variation in the light from the detecting part.

Japanese Laid-Open Patent Application JP-A-Heisei, 11-67061 discloses a field emission cathode and a magnetic sensor. The field emission cathode is formed of a glass fiber cut to have a tapered surface at a front end thereof and carbon fibers embedded at a longitudinal center part of the glass fiber. A peripheral part of the glass fiber is coated with a conductive material with the glass fiber being electrically isolated from the carbon fibers.

Japanese Laid-Open Patent Application JP-P2001-281470A discloses a ferromagnetic material-containing optical fiber, a current sensor and a magnetic field sensor using the optical fiber. The current sensor has a light source for emitting light, a beam splitter for splitting incident light into two directions, a polarizing plate for linearly polarizing light, an optical fiber whose end face is covered with a magnetic film including particles of a ferromagnetic material, and a detector for detecting light. Light emitted from the light source enters the optical fiber through the beam splitter and the polarizing plate. The incident light reflects on an end opposite to an incident end of the optical fiber and is emitted from the incident end. The emitted light is incident to the detector through the polarizing plate and the beam splitter.

Japanese Laid-Open Patent Application JP-P2000-162566A discloses a magneto-optic effect enhancing element and a manufacturing method thereof. The magneto-optic effect enhancing element has a sandwiched structure in which a ferritic film is sandwiched between first and second dielectric multilayer reflective films so as to satisfy the Fabry-Perot resonance condition. The ferritic film is manufactured by a ferritic plating method at the range of 20° C. and 100° C.

Japanese Laid-Open Patent Application JP-A-Showa, 60-263866 discloses a technique of a photoelectric field sensor. The photoelectric field sensor has a Pockels element having a Pockels effect of generating a phase difference in orthogonal components of polarized light due to the electric field. The photoelectric field sensor has a sensor part including a polarizer, the Pockels element, a ⅛-wavelength plate and a reflecting mirror at the front end of the optical fiber. Through the optical fiber, light from a light source is transmitted to the Pockels element, passes through the Pockels element and is reflected on the reflecting mirror. The reflected light passes through the Pockels element again and is transmitted to a light-receiving part.

Another related technique is disclosed in T. Ohara, et al., "Two-Dimensional Field Mapping of Microstrip Lines with a Band Pass Filter or a Photonic Bandgap Structure by Fiber-Optic EO Spectrum Analysis System", Proc. Int. Topical Meeting Microwave Photonics, Oxford, U. K., September 2000, pp. 210-213.

Another related technique is also disclosed in S. Wakana, et al., "Fiber-Edge Electro-optic/Magneto-optic Probe for Spectral-Domain Analysis of Electromagnetic Field", IEEE Trans. Microwave Theory Tech., vol. 48, No. 12, December 2000, pp. 2611-2616.

Another related technique is also disclosed in E. Yamazaki, et al., "Three-Dimensional Magneto-optic Near-Field Mapping over 10-50 μm-Scale Line and Space Circuit Patterns", Proc. the 14th Annual Meeting of the IEEE Lasers & Electro-optics Society, November 2001, p. 318.

Another related technique is also disclosed in E. Yamazaki, et al., "High-Frequency Magneto-Optic Probe Based on BiRIG Rotation Magnetization", IEICE Trans. Electron., Vol. E86-C, No. 7, July 2003, pp. 1338-1344.

Another related technique is also disclosed in M. Iwanami, et al, "Wideband Magneto-optic Probe with 10 μm-Class spatial Resolution", Japanese Journal of Applied Physics, Vol. 43, No. 4B, April 2004, pp. 2288-2292.

DISCLOSURE OF INVENTION

An object of the present invention is to provide an electric field sensor, a magnetic field sensor, an electromagnetic field sensor and an electromagnetic field measuring system using these sensors, which are more compact, have higher spatial resolution and can be applied to a micro region of an LSI chip/package.

Another object of the present invention is to provide an electric field sensor, a magnetic field sensor, an electromagnetic field sensor and an electromagnetic field measuring system using these sensors, which can measure two-dimensional information without scanning.

To solve the above-mentioned problem, an electromagnetic field sensor of the present invention includes an optical fiber and an optic layer configured to be provided on an end surface of an end portion of the optical fiber and reflect light entering through the optical fiber.

In the above-mentioned electromagnetic field sensor, the optic layer may include an electro-optic layer. In the above-mentioned electromagnetic field sensor, the optic layer may include a magneto-optic layer. In the above-mentioned electromagnetic field sensor, the end surface may be a convex shape. In the above-mentioned electromagnetic field sensor, the optical fiber may have the end portion with a shape of a substantial cone formed by extending the end portion. The optic layer may be formed on a side surface of a front end of the substantial cone. The above-mentioned electromagnetic field sensor may further include a dielectric layer between the optic layer and the end surface. The above-mentioned electromagnetic field sensor may further include a plurality of optical fibers each having the optic layer, including the optical fiber, the plurality of optical fibers may be tied in a bundle. In the above-mentioned electromagnetic field sensor, the plurality of optical fibers may be tied in a bundle in one-dimensional way. In the above-mentioned electromagnetic field sensor, the plurality of optical fibers may be tied in a bundle in two-dimensional closest-packed way.

The above-mentioned electromagnetic field sensor may have a plurality of electric field sensors configured to detect electric fields as the electromagnetic field sensor as stated in any of the above-mentioned provisions and a plurality of magnetic field sensors configured to detect magnetic fields as the electromagnetic field sensor as stated in any of the above-mentioned provisions. The plurality of electric field sensors and the plurality of magnetic field sensors may be tied in a bundle. In the above-mentioned electromagnetic field sensor, each of the plurality of electric field sensors and each of the plurality of magnetic field sensors may be alternately arranged and tied in a bundle.

To solve the above-mentioned problem, an electromagnetic field measuring system of the present invention has a laser beam source, an electromagnetic field sensor and a detecting section. The laser beam source emits light. The electromagnetic field sensor is described in any of the above-mentioned provisions. The detecting section detects reflected light.

To solve the above-mentioned problem, a manufacturing method of an electromagnetic field sensor of the present invention includes steps of (a) forming one of an electro-optic layer and a magneto-optic layer on an end surface of an end portion of an optical fiber as a sensor layer by an aerosol deposition method, and (b) performing heat treatment to the sensor layer.

In the manufacturing method of the electromagnetic field sensor, the step (a) may include a step of (a1) polishing the end portion to form the end surface with a convex shape. In the manufacturing method of the electromagnetic field sensor, the step (a) may include a step of (a2) extending the end portion to form the end surface with a shape of a substantial cone.

To solve the above-mentioned problem, an electromagnetic field detecting method of an electromagnetic field sensor of the present invention includes steps of (m) acquiring a first detecting signal detected by a first sensor among a plurality of sensors tied in a bundle, (n) acquiring a second detecting signal detected by a second sensor among the plurality of sensors, (o) calculating a first averaged signal as an average between the first detecting signal and the second detecting signal, (p) acquiring a third detecting signal detected by the other sensor which acquire no detecting signal among the plurality of sensors, (q) calculating an average between the first averaged signal and the third detecting signal as the first averaged signal, and (r) repeating the step (p) and the step (q) until detecting signals detected by all of the plurality of sensors are averaged. Each of the plurality of sensors includes an optical fiber and one of an electro-optic layer and a magneto-optic layer configured to be provided on an end surface with a convex shape of an end portion of the optical fiber.

According to the present invention, the electromagnetic field sensor and the electromagnetic field measuring system using the sensor are provided, wherein the sensor are more compact, have higher spatial resolution and can be applied to a micro region of an LSI chip/package. Furthermore, the electromagnetic field sensor and the electromagnetic field measuring system using the sensor are provided, wherein the sensor can measure two-dimensional information and improve sensitivity through signal processing without scanning.

BEST MODE FOR CARRYING OUT THE INVENTION

Hereinafter, exemplary embodiments of an electromagnetic field sensor and an electromagnetic field measuring system using the sensor according to the present invention will be described referring to attached drawings.

First Exemplary Embodiment

A first exemplary embodiment of an electromagnetic field sensor and an electromagnetic field measuring system using the sensor according to the present invention will be described referring to attached drawings. Here, an electric field sensor as an electromagnetic field sensor and an electric field measuring system using the electric field sensor as an electromagnetic field measuring system will be described.

Figure 1A:
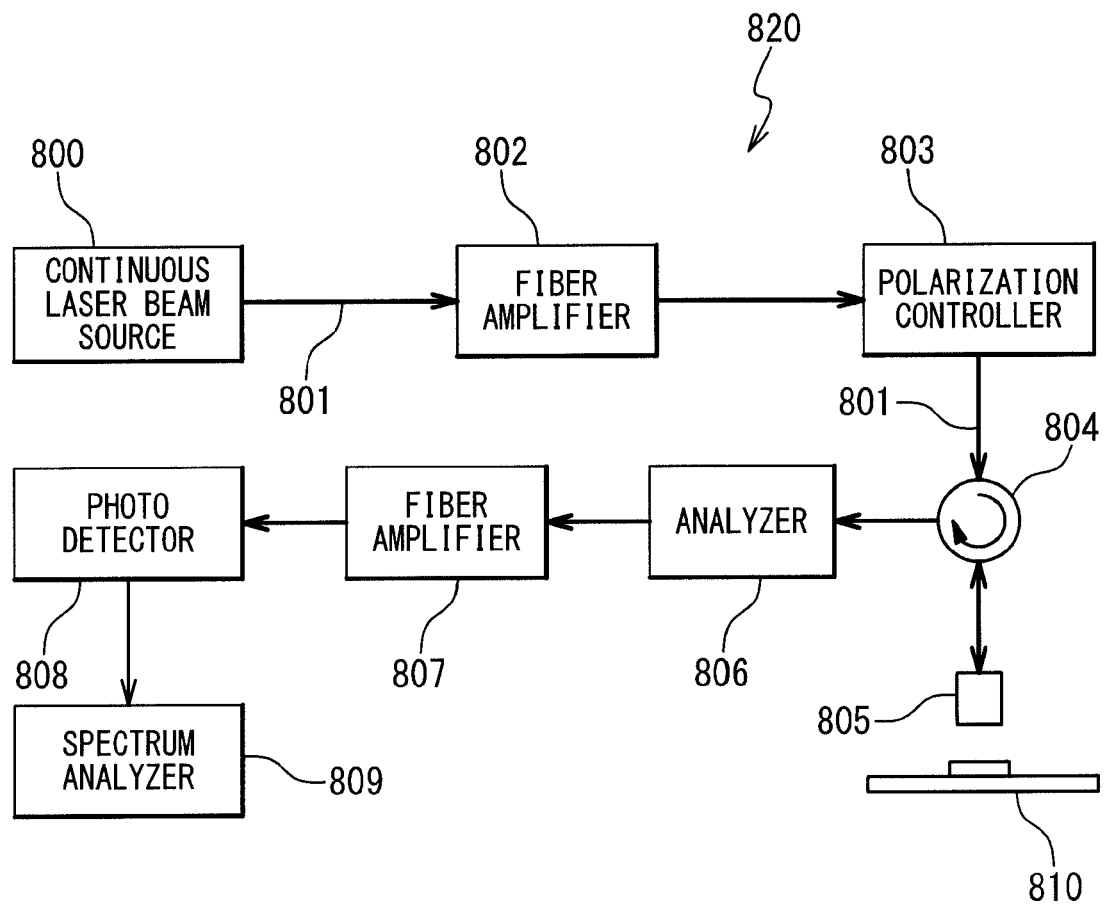
FIG. 1A is a block diagram showing an example of a conventional electric (magnetic) field measuring system.
Figure 1B:
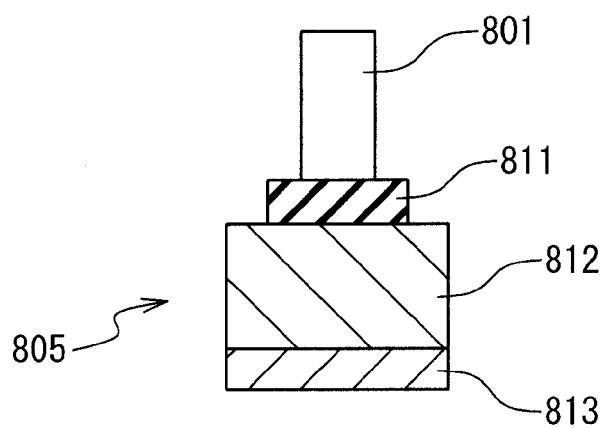
FIG. 1B is a sectional view of an electric field sensor used in the conventional electric (magnetic) field measuring system.
Figure 2A:
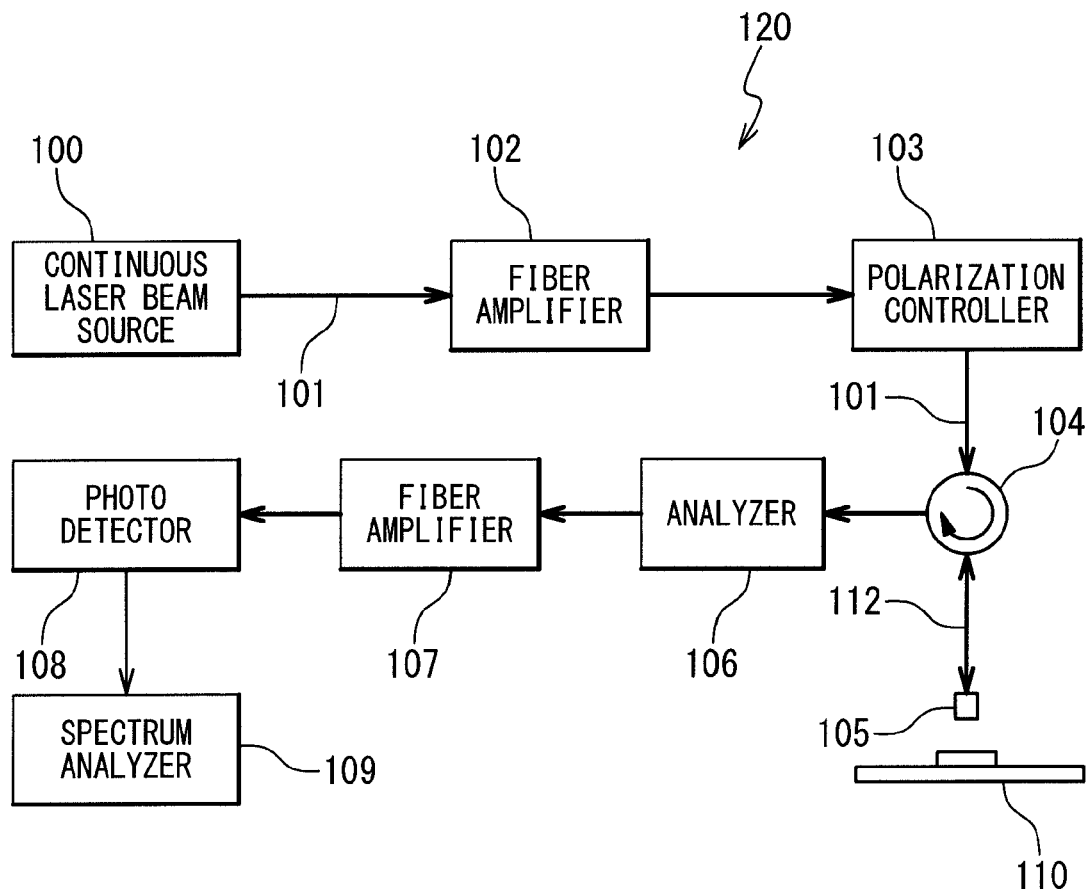
FIG. 2A is a block diagram showing a configuration of an electric field measuring system using an electric field sensor in a first exemplary embodiment according to the present invention.
Figure 2B:
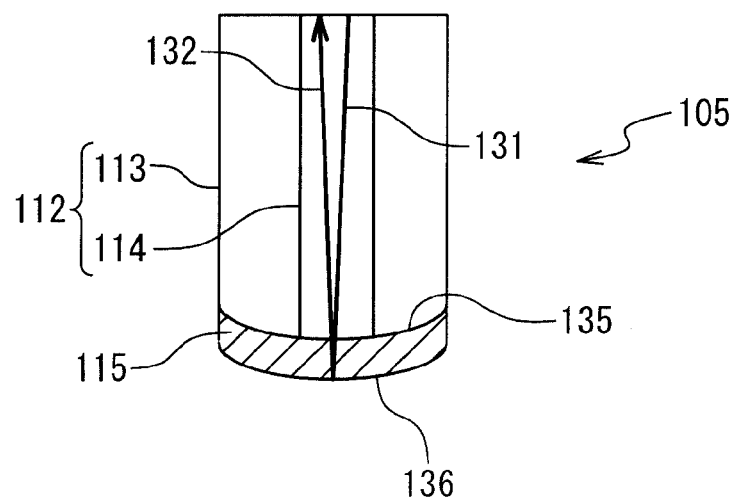
FIG. 2B is a sectional view of the electric field sensor in the first exemplary embodiment according to the present invention.

FIG. 2A is a block diagram showing a configuration of the electric field measuring system using the electric field sensor in the first exemplary embodiment according to the present invention. FIG. 2B is a sectional view of the electric field sensor in the first exemplary embodiment according to the present invention. The electric field measuring system 120 includes, as shown in FIG. 2A, an optical fiber 101, a continuous laser beam source 100, a fiber amplifier 102, a polarization controller 103, an optical circulator 104, an electric field sensor 105, an analyzer 106, a fiber amplifier 107, a photo detector 108 and a spectrum analyzer 109.

The optical fiber 101, the continuous laser beam source 100, the fiber amplifier 102, the polarization controller 103, the optical circulator 104, the analyzer 106, the fiber amplifier 107, the photo detector 108, the spectrum analyzer 109 are similar to the optical fiber 801, the continuous laser beam source 800, the fiber amplifier 802, the polarization controller 803, the optical circulator 804, the analyzer 806, the fiber amplifier 807, the photo detector 808 and the spectrum analyzer 809, respectively. However, according to the present invention, an optical fiber 112 is placed between the optical circulator 104 and the electric field sensor 105.

The electric field sensor 105 includes, as shown in FIG. 2B, the optical fiber 112 and an electro-optic layer 115. The optical fiber 112 includes a clad layer 113 and a core layer 114. One end portion of the optical fiber 112 is connected to the optical circulator 104. An end surface 135 of the other end portion of the optical fiber 112 is processed to be a convex curved surface by polishing. The electro-optic layer 115 as a minute electric field detecting element is directly formed on the end surface 135. An outer surface 136 of the electro-optic layer 115 is directed to an object to be measured. Since the electro-optic layer 115 is formed to have the convex curved surface, light is condensed on the curved surface. As a result, the volume of the sensor beam is preferably reduced, thereby improving resolution in comparison to conventional.

Next, an operation of the electric field measuring system in the first exemplary embodiment according to the present invention will be described. The continuous laser beam source 100 emits a laser beam. The fiber amplifier 102 amplifies the laser beam. The polarization controller 103 controls a polarization plane of the laser beam. The optical circulator 104 emits the laser beam to the electric field sensor 105. The laser beam (131) passing in the core layer 114 of the optical fiber 112 is reflected by a bottom surface of the electro-optic layer 115 with a difference between a refraction index of the electro-optic layer 115 and that of air. At this time, the refraction index of the electro-optic layer 115 changes depending on electric field generated from the circuit board 110. With this change, a polarization state of the laser beam propagating in the electro-optic layer 115 is modulated based on an intensity of the external electric field. The optical circulator 104 returns the modulated and reflected laser beam (132) to the optical fiber 101 again. The analyzer 106 converts the laser beam into intensity modulated light. The fiber amplifier 107 amplifies the converted laser beam. The photo detector 108 converts the amplified laser beam into an electric signal. The spectrum analyzer 109 detects the electric signal. A peak of the electric signal detected by the spectrum analyzer 109 corresponds to a signal caused by the external electric field. According to the principles of this system, an intensity of the signal varies depending on the intensity of the external electric field. For this reason, electric field distribution can be obtained by changing the location of the electric field sensor 105 on the circuit board 110.

The spatial resolution of the electric field sensor is determined by the volume of the sensor beam (laser beam) propagating in the electro-optic layer 115. As the volume of the sensor beam (laser beam) is smaller, the spatial resolution becomes higher.

Since vertical resolution is determined by a thickness of the electro-optic layer 115, it is preferred that the electro-optic layer 115 is thin. Conventionally, the layer is made thin by processing a bulk electro-optic member, and then, bonded to a front end of the optical fiber. The process limitation for making the bulk member thin by processing is approximately 10 μm. For this reason, it is difficult to improve the vertical resolution. According to the present invention, however, the electro-optic layer 115 as a thin film is formed directly on a front end of the optical fiber 112 which is processed to the convex curved surface by polishing. Accordingly, the electro-optic layer 115 can be made thinner without being limited by the process limitation of 10 μm. Thus, the vertical resolution can be improved. Preferably, the thickness of the electro-optic layer 115 is equal to or thicker than 1 μm (micrometer), and equal to or thinner than 8 μm (micrometer), for example. When the thickness of the electro-optic layer 115 is thinner than 1 μm, an S/N ratio large enough to measure electric field cannot be obtained. When the thickness of the electro-optic layer 115 is thinner than 8 μm, preferable high resolution can be obtained.

Since horizontal resolution is determined by a diameter of the laser beam propagating in the electro-optic layer 115, it is preferred to narrow down the optical diameter. Conventionally, as described above, an optical diameter cannot be sufficiently narrowed down due to an existence of the adhesive layer. According to the present invention, as described above, since the electro-optic layer 115 as a thin film is formed directly on the front end of the optical fiber 112, an adhesive layer is unnecessary. Thus, the diameter of the laser beam can be narrowed down without being interfered by the adhesive layer. Therefore, the horizontal resolution can be improved.

As described above, the spatial resolution of the electric field sensor 105 can be increased by improving the vertical and horizontal resolutions.

Next, a manufacturing method of the electric field sensor in the first exemplary embodiment according to the present invention will be described.

The electro-optic layer 115 is formed by using an aerosol deposition method. In the aerosol deposition method, first, an aerosol generator is filled with ultrafine particles. Next, carrier gas (e.g. nitrogen, air) is introduced into the aerosol generator to produce aerosol in which the ultrafine particles are uniformly dispersed. The aerosol is supplied to a film forming chamber, and injected from a nozzle to a substrate to be accumulated thereon. Thus, a desired film is formed. Here, since the ultrafine particles (brittle materials) reach the substrate with mechanical impact force, the particles are accumulated while being crushed on the substrate.

Figure 17:
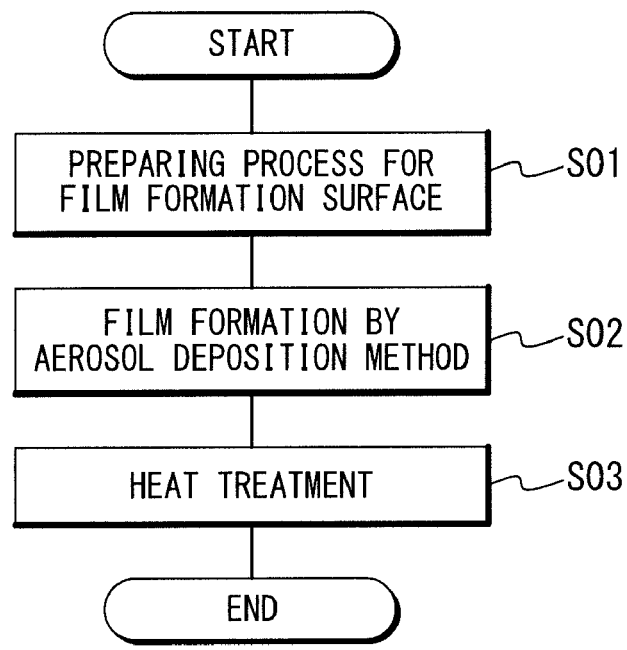
FIG. 17 is a flow chart showing a manufacturing method of the magnetic field sensor in an exemplary embodiment according to the present invention.

FIG. 17 is a flow chart showing a manufacturing method of the electric field sensor in the exemplary embodiment according to the present invention.

First, a substrate used for film formation in the aerosol deposition method is prepared (Step S01). The optical fiber 112 is used as the substrate. A film forming surface is the end surface 135 on the end portion of the optical fiber 112. The end portion of the optical fiber 112 is processed to the convex curved surface by polishing. Next, a film is formed by using the aerosol deposition method (Step S02). Film forming conditions of the electro-optic layer 115 according to the aerosol deposition method are as follows. A thickness of the electro-optic layer 115 is set to 6000 nm. Pb (Zr0.6Ti0.4)03 (hereinafter, referred to as "PZT") is used as raw powder, and oxygen is used as the carrier gas. An incident angle of the nozzle to the substrate (the end surface 135 of the optical fiber 112) is set to 10 degrees, a gas flow rate is set to 12 liters/minute, a distance between the nozzle and the substrate is set to 5 mm, a film forming rate is set to 0.8 μm/minute and a vibration frequency of a vibration generator is set to 250 rpm.

Then, the following processing including heat treatment is carried out (Step S03). That is, first, following film formation, the electro-optic layer 115 is heated in atmosphere at 600° C. for 15 minutes. The electro-optic effect of the electro-optic layer 115 appears by the heat treatment. The layer is polarized at 200° C. under application of electric field of approximately 100 kV/cm. A linear electro-optic coefficient r33 is 200 pm/V. After heat treatment, to remove irregularity of the surface 136 of the electro-optic layer 115, the layer is polished to have a thickness of 5400 nm for planarization.

The electric field sensor 105 is formed by using the above-mentioned manufacturing method.

In the above-mentioned description, the case is explained in which the electro-optic layer 115 is composed of PZT. However, composition is not limited to PZT and, for example, La may be added. In addition to lead zirconate titanate (PZT), materials with high electro-optic effect such as barium titanate, strontium-substituted barium titanate and tantalum-substituted potassium niobate can be also used.

One of features of the present invention is that the film of the electro-optic layer 115 is formed by using the aerosol deposition method. The reason is as follows. An object of the present invention is to provide an electric field sensor with high resolution. Thus, it is preferred that the electro-optic layer 115 as a thin film is formed directly on a front end of the processed optical fiber. To obtain a S/N ratio large enough to measure electric field, a thickness of the layer is preferably 1 μm or more. It is not possible to form a ferroelectric transparent film of 1 μm on plastics, resin including polymers or a dielectric with an arbitrary composition by using a sputtering method or a sol-gel method. But it is possible to form such thin film only by using the aerosol deposition method.

Figure 3:
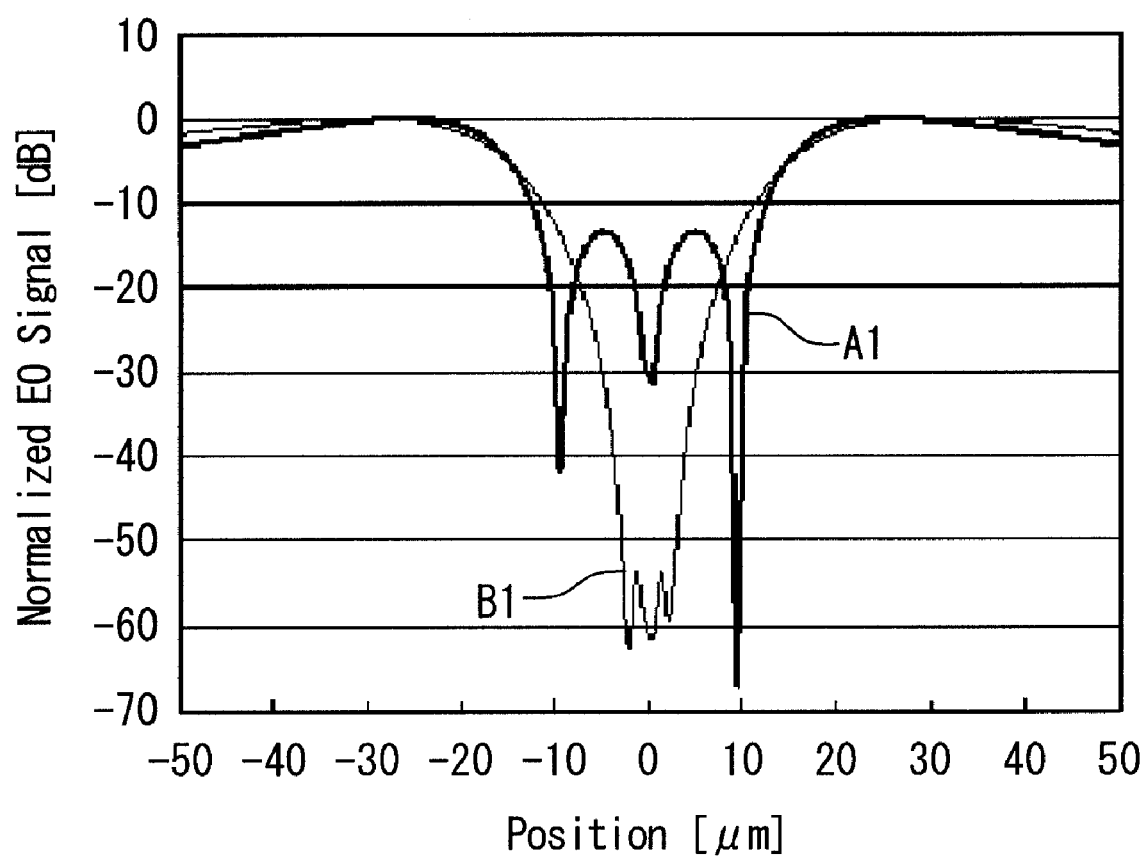
FIG. 3 is a graph showing an example of electric field distribution measured by using the electric field sensor in the present invention and the conventional electric field sensor.

FIG. 3 is a graph showing an example of electric field distribution measured by using the electric field sensor in the present invention and the conventional electric field sensor. A curve A1 shows a case of using the electric field sensor of the present invention and a curve B1 shows a case of using the conventional electric field sensor. A horizontal axis represents a position and a vertical axis represents an electric signal corresponding to an electric field intensity. The electric field distribution is measured above a three meander line with line width/interval of 5 μm.

A signal of 10 MHz and 15 dBm is applied to the meander line. The electric field distribution is obtained when the electric field sensor is placed at the position above the meander line by 10 μm and scanned at intervals of 1 μm in a direction of crossing the meander line. In a case of the conventional electric field sensor, a peak of electric field to be observed between adjacent lines is unclear (curve B1). On the contrary, in a case of the electric field sensor of the present invention, a peak of electric field is clearly observed (curve A1). This result reveals that the electric field sensor of the present invention has a higher spatial resolution than the conventional electric field sensor.

Figure 4:
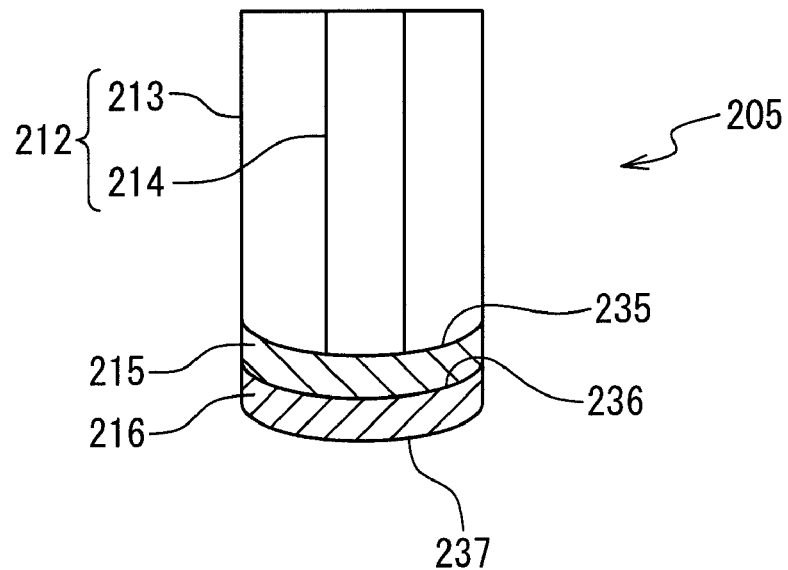
FIG. 4 is a sectional view showing a configuration of a variation of the electric field sensor in the first exemplary embodiment according to the present invention.

FIG. 4 is a sectional view showing a configuration of a variation of the electric field sensor in the first exemplary embodiment according to the present invention. An electric field sensor 205 has a higher sensitivity than the electric field sensor 105. The electric field sensor 205 includes an optical fiber 212, an electro-optic layer 215 and a dielectric multilayer film reflective layer 216. The optical fiber 212 is formed of a core layer 214 and a clad layer 213 surrounded the core layer 214. An end surface 235 of the optical fiber 212 is processed to a convex curved surface by polishing. The electro-optic layer 215 as a minute electric detecting element is formed directly on the end surface 235. The dielectric multilayer film reflective layer 216 is formed on an outer surface 236 of the electro-optic layer 215. For example, after the step S03 in FIG. 17, a step of forming the dielectric multilayer film reflective layer 216 by using an ion plating method is added. Due to an existence of the dielectric multilayer film reflective layer 216, the amount of reflected laser beam can be increased. Thus, an S/N ratio can be increased.

An outer surface 237 of the dielectric multilayer film reflective layer 216 is directed to an object to be measured.

Figure 5:
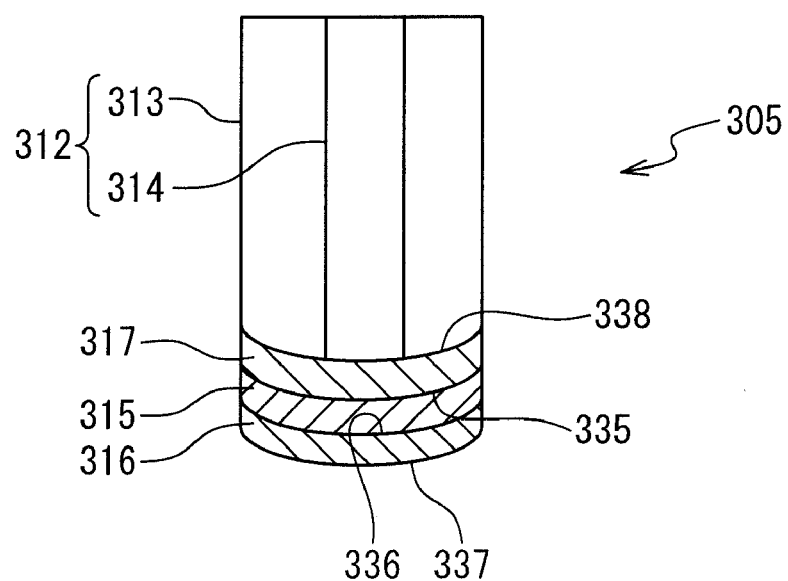
FIG. 5 is a sectional view showing a configuration of another variation of the electric field sensor in the first exemplary embodiment according to the present invention.

FIG. 5 is a sectional view showing a configuration of another variation of the electric field sensor in the first exemplary embodiment according to the present invention. An electric field sensor 305 has a higher sensitivity than the electric field sensor 205. The electric field sensor 305 includes an optical fiber 312, a lower dielectric multilayer film reflective layer 317, an electro-optic layer 315 and an upper dielectric multilayer film reflective layer 316. The optical fiber 312 is formed of a core layer 314 and a clad layer 313 surrounding the core layer 314. An end surface 338 of the optical fiber 312 is processed to a convex curved surface by polishing. The lower dielectric multilayer film reflective layer 317 is formed directly on the end surface 338. For example, between the step S01 and the step S02 in FIG. 17A, a step of forming the lower dielectric multilayer film reflective layer 317 by using the ion plating method is added. The electro-optic layer 315 as an electric detecting element is formed on a surface 335 of the lower dielectric multilayer film reflective layer 317. The electro-optic layer 315 is formed as in the steps S02, S03 in FIG. 17. The upper dielectric multilayer film reflective layer 316 is formed on an outer surface 336 of the electro-optic layer 315. For example, after the step S03 in FIG. 17, a step of forming the upper dielectric multilayer film reflective layer 316 by using the ion plating method is added. The lower dielectric multilayer film reflective layer 317, the electro-optic layer 315 and the upper dielectric multilayer film reflective layer 316 constitutes a Fabry-Perot resonator structure. Such Fabry-Perot resonator structure causes multiple reflection of the laser beam on the upper surface (336) and the lower surface (335) of the electro-optic layer 315. This means an increase in a light path length in the electro-optic layer 315, resulting in an increase in degree of light modulation and a further improvement of the S/N ratio.

According to the present invention, the electromagnetic field sensor and an electromagnetic field measuring system using the sensor, which are more compact, have higher spatial resolution and can be applied to a micro region of an LSI chip/package, can be achieved.

Second Exemplary Embodiment

A second exemplary embodiment of the electromagnetic field sensor and the electromagnetic field measuring system using the sensor according to the present invention will be described referring to the attached drawings. Here, an electric field sensor as an electromagnetic field sensor and an electric field measuring system using the electric field sensor as the electromagnetic field measuring system will be described.

In the present exemplary embodiment, an electric field measuring system is basically similar to the electric field measuring system 120 in the first exemplary embodiment. However, a configuration of an electric field sensor 405 in the electric field measuring system in the present exemplary embodiment is different from that of the electric field sensor 105 in the first exemplary embodiment.

Figure 6:
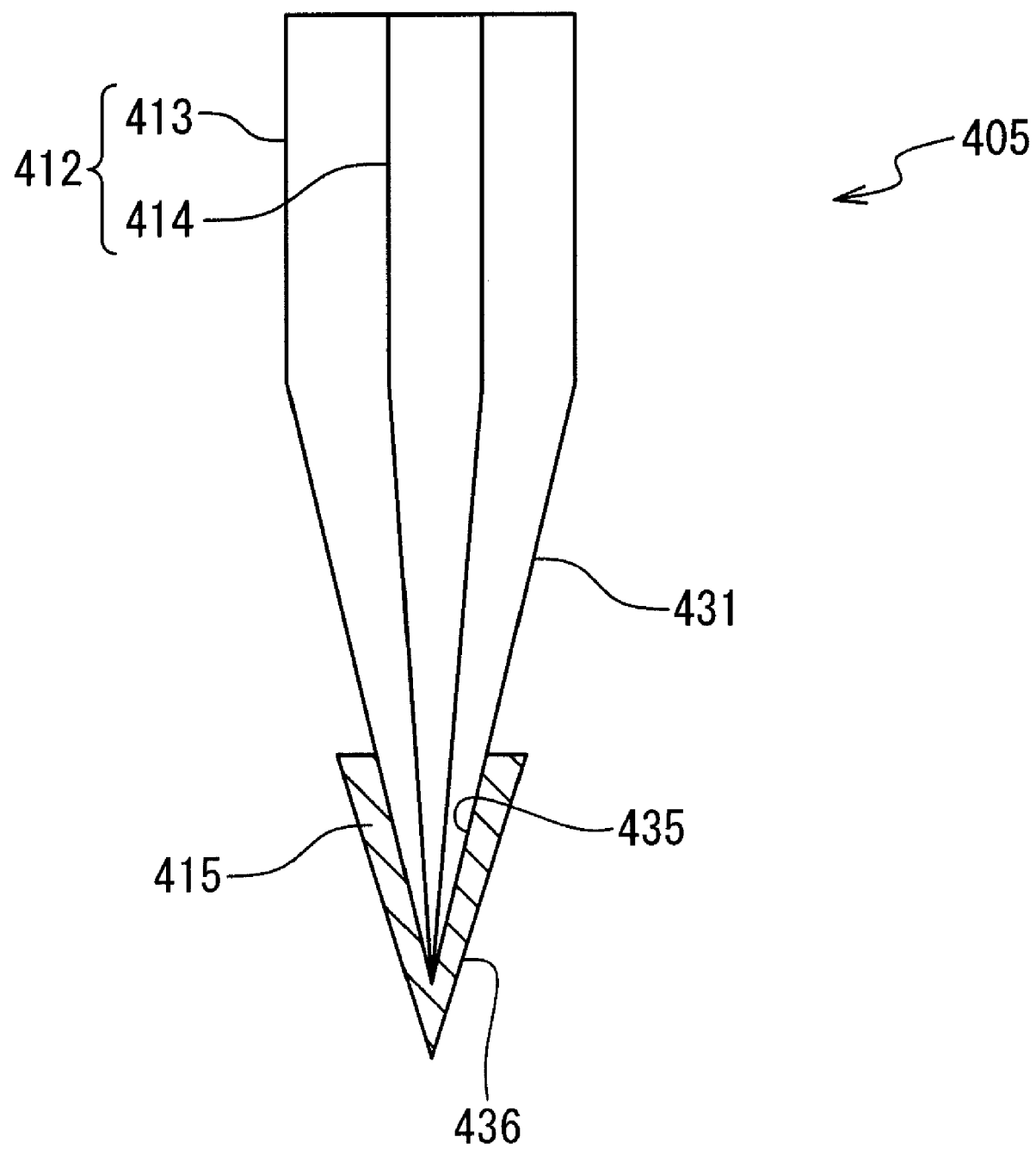
FIG. 6 is a sectional view showing a configuration of an electric field sensor in a second exemplary embodiment according to the present invention.

FIG. 6 is a sectional view showing a configuration of the electric field sensor in the second exemplary embodiment according to the present invention. The electric field sensor 405 includes an optical fiber 412 and an electro-optic layer 415. The optical fiber 412 includes a clad layer 413 and a core layer 414. One end portion of the optical fiber 412 is connected to the optical circulator 104. The other end portion forms a cone 431. However, the cone does not necessarily have an accurate conical shape, and may have substantially conical shape which can be formed when the end portion is extended by a pulling operation during heating. The electro-optic layer 415 as a minute electric detecting element is formed directly on a side surface (curved surface) 435 of a front end portion of the cone 431. An outer surface 436 of the electro-optic layer 415 is directed to an object to be measured. Other configuration of the electric field sensor 405 is the same as that in the first exemplary embodiment.

Next, an operation of the electric field measuring system in the second exemplary embodiment according to the present invention is the same as that in the first exemplary embodiment except that the electric field sensor 405 is used.

Also in this case, the same effect as that in the first exemplary embodiment can be obtained. Moreover, the electric field sensor 405 in the present exemplary embodiment can further focus the laser beam than the electric field sensor 105 in the first exemplary embodiment which is produced by forming the electro-optic layer 115 on the front end of the optical fiber 112 processed to the convex curved surface 135. Thus, the electric field sensor 405 has higher spatial resolution than the electric field sensor 105 in the first exemplary embodiment.

The shape of the end portion of the optical fiber is not limited to the shape of in the first exemplary embodiment and the present exemplary embodiment. Preferably, the end portion is shaped like the front end portion of the optical fiber 412 so that the laser beam reflected by the end portion is easy to be collected. This can increase the laser beam contributing to measurement and improve sensitivity of the electric field sensor and the S/N ratio.

Next, a manufacturing method of the electric field sensor in the second exemplary embodiment according to the present invention is the same as the manufacturing method in the first exemplary embodiment shown in FIG. 17 except that the optical fiber 412 is used. Here, the end portion of the optical fiber 412 as a substrate at the step S01 is processed as follows.

First, the end portion is extended by a pulling operation while being heated and cut at a proper position. Then, the front end portion is keenly sharpened. Also in this case, the same effect as that in the first exemplary embodiment can be obtained.

Figure 7:
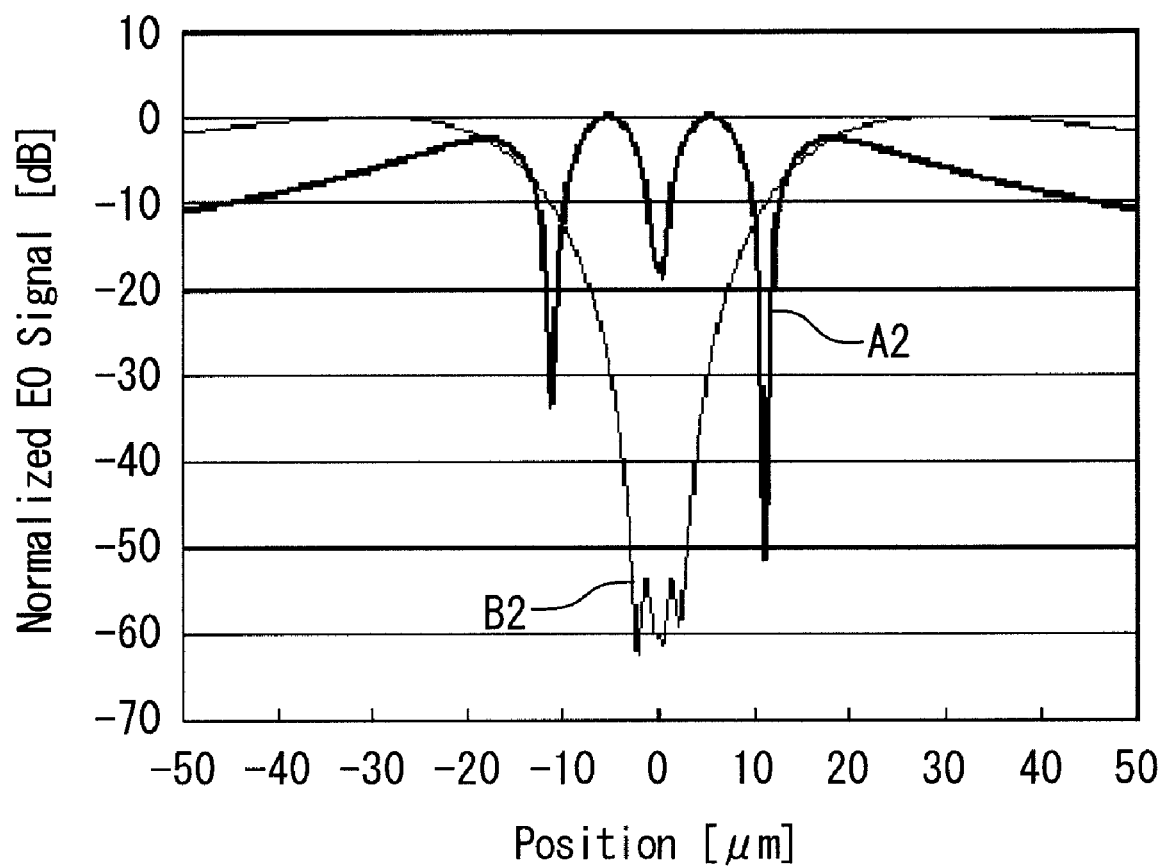
FIG. 7 is a graph showing an example of electric field distribution measured by using the electric field sensor in the present invention and the conventional electric field sensor.

FIG. 7 is a graph showing an example of electric field distribution measured by using the electric field sensor in the present invention and the conventional electric field sensor. A curve A2 shows a case of using the electric field sensor of the present invention and a curve B2 shows a case of using the conventional electric field sensor. A horizontal axis represents a position and a vertical axis represents an electric signal corresponding to the electric field intensity. The electric field distribution is measured above a three-meander line with line width/interval of 5 μm. A signal of 10 MHz and 15 dBm is applied to the meander line. The electric field distribution is obtained when the electric field sensor is placed at a position above the meander line by 10 μm and scanned at intervals of 1 μm in a direction of crossing the meander line. In a case of the conventional electric field sensor, a peak of electric field to be observed between adjacent lines is unclear (curve B2). On the contrary, in the case of the electric field sensor of the present invention, a peak of electric field is clearly observed (curve A2). This result reveals that the electric field sensor of the present invention has a higher spatial resolution than the conventional electric field sensor. As compared with the case of using the electric field sensor 105 in the first exemplary embodiment, a relative intensity of peaks of electric field at two points in the central part is higher. FIG. 7 reveals that the electric field sensor 405 in the present exemplary embodiment has higher spatial resolution than the electric field sensor 105 in the first exemplary embodiment.

According to the present invention, the electromagnetic field sensor and an electromagnetic field measuring system using the sensor, which are more compact, have higher spatial resolution and can be applied to a micro region of an LSI chip/package, can be achieved.

Third Exemplary Embodiment

A third exemplary embodiment of the electromagnetic field sensor and the electromagnetic field measuring system using the sensor according to the present invention will be described referring to the attached drawings. Here, an electric field sensor as an electromagnetic field sensor and an electric field measuring system using the electric field sensor as the electromagnetic field measuring system will be described.

The electric field measuring system in the present exemplary embodiment is the basically same as the electric field measuring system 120 in the first exemplary embodiment. However, the present exemplary embodiment is different from the first exemplary embodiment in that a plurality of electric field sensors 105 tied in a bundle performs electric field measurement at a plurality of points at a time, not electric field measurement at one point at a time.

Figure 8:
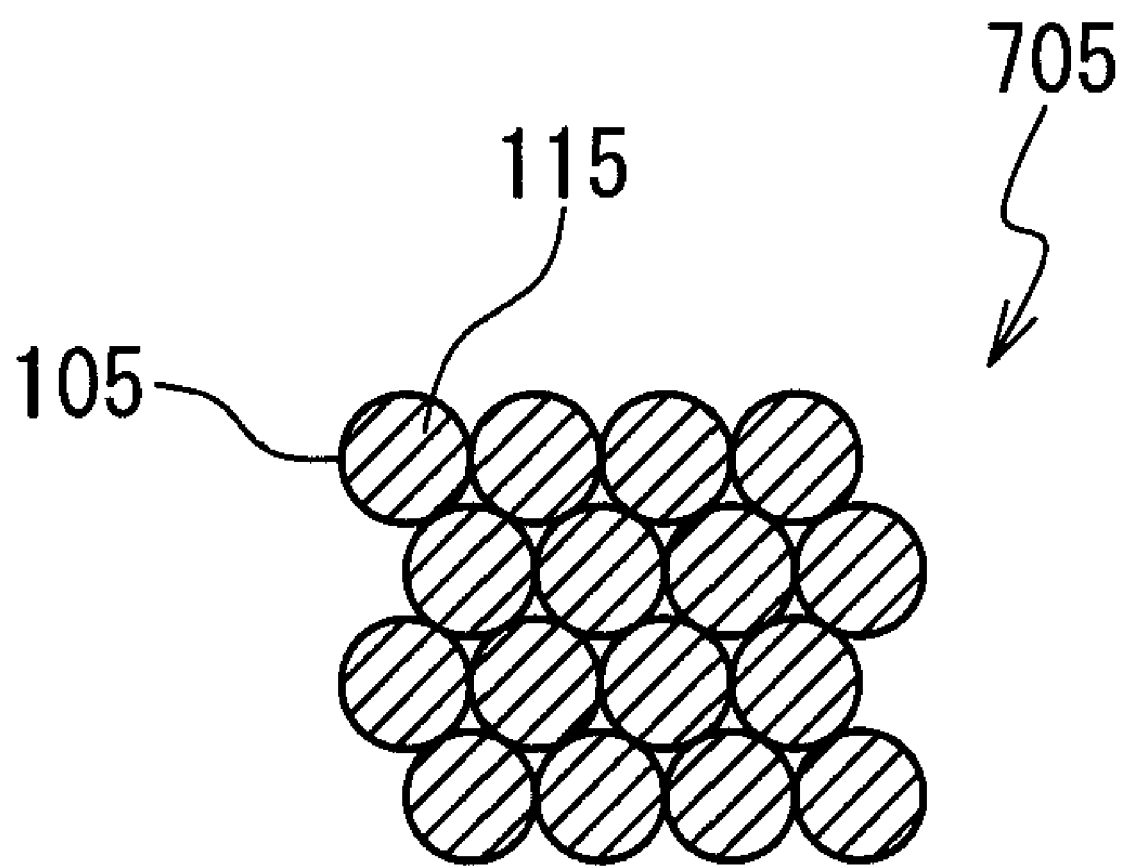
FIG. 8 is a view showing an example of an electric field sensor formed by tying a plurality of the electric field sensors in the first exemplary embodiment.

In a method of electric field measurement at a plurality of points, for example, a plurality of electric field measuring systems 120 are prepared and a plurality of electric field sensors 105 belonging to the systems 120 are tied in a bundle. FIG. 8 is a view showing an example of an electric field sensor 705 formed by tying a plurality of electric field sensors 105 in the first exemplary embodiment. FIG. 8 is a view when viewed from a side of the electro-optic layer 115. In the electric field sensor 705, one-dimensionally aligned electric field sensors 105 are tied so as to be two-dimensionally closest-packed (in a staggered or honeycomb arrangement). Data sent from the spectrum analyzer 109 of each electric field measuring system 120 are processed by one computer (not shown).

Since the electric field intensity is measured by using the electric field sensor 705 formed of the electric field sensors 105 tied in a bundle, two-dimensional distribution of the electric field intensity with high resolution can be obtained without scanning in a much shorter time period than conventional.

The electric field sensor may be formed of only a plurality of electric field sensors 105 aligned in a line in one-dimensional way. In this case, by scanning the sensor in the direction perpendicular to the tying direction at small intervals, two-dimensional distribution of the electric field intensity with high resolution can be obtained in a shorter time period than conventional.

One electric field measuring system 120 may use the electric field sensor 705 as an electric field sensor. In this case, a laser switching section (not shown) for continuously switching the electric field sensor 105 in the electric field sensor 705 into which the laser beam enters is provided between the optical circulator 104 and the electric field sensor 705. In this manner, one electric field measuring system 120 can continuously measure two-dimensional distribution of the electric field intensity with high resolution.

When the electric field sensor 705 formed of a plurality of optical fibers tied in a bundle is used, by detecting an averaged signal among the individual electric field sensors 105 constituting the electric field sensor 705, noise can be averaged. Thus, the S/N ratio can be increased. The averaged signal is detected by a program in an information processor built in the spectrum analyzer 109 or an information processor (described later) connected to the spectrum analyzer 109.

Figure 16:
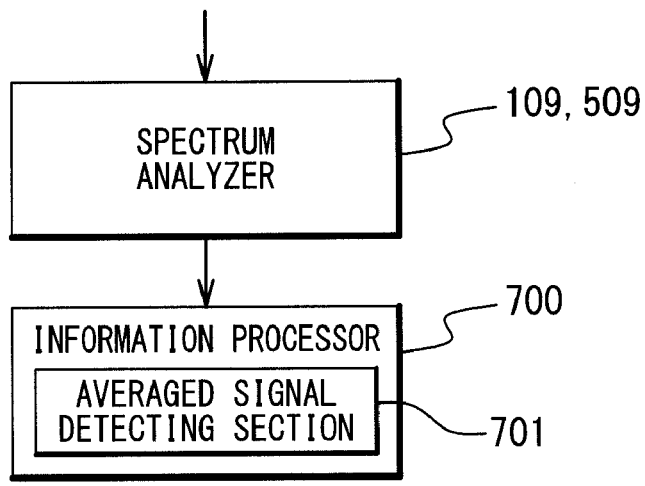
FIG. 16 is a block diagram showing a configuration of an information processor included in the electric field measuring system.

FIG. 16 is a block diagram showing a configuration of an information processor 700 included in the electric field measuring system 120 (magnetic field measuring system 520). The information processor 700 is exemplified by a computer and connected to the spectrum analyzer 109, 509. The information processor 700 stores an averaged signal detecting section 701 as a program for detecting the averaged signal in an internal memory.

Figure 18:
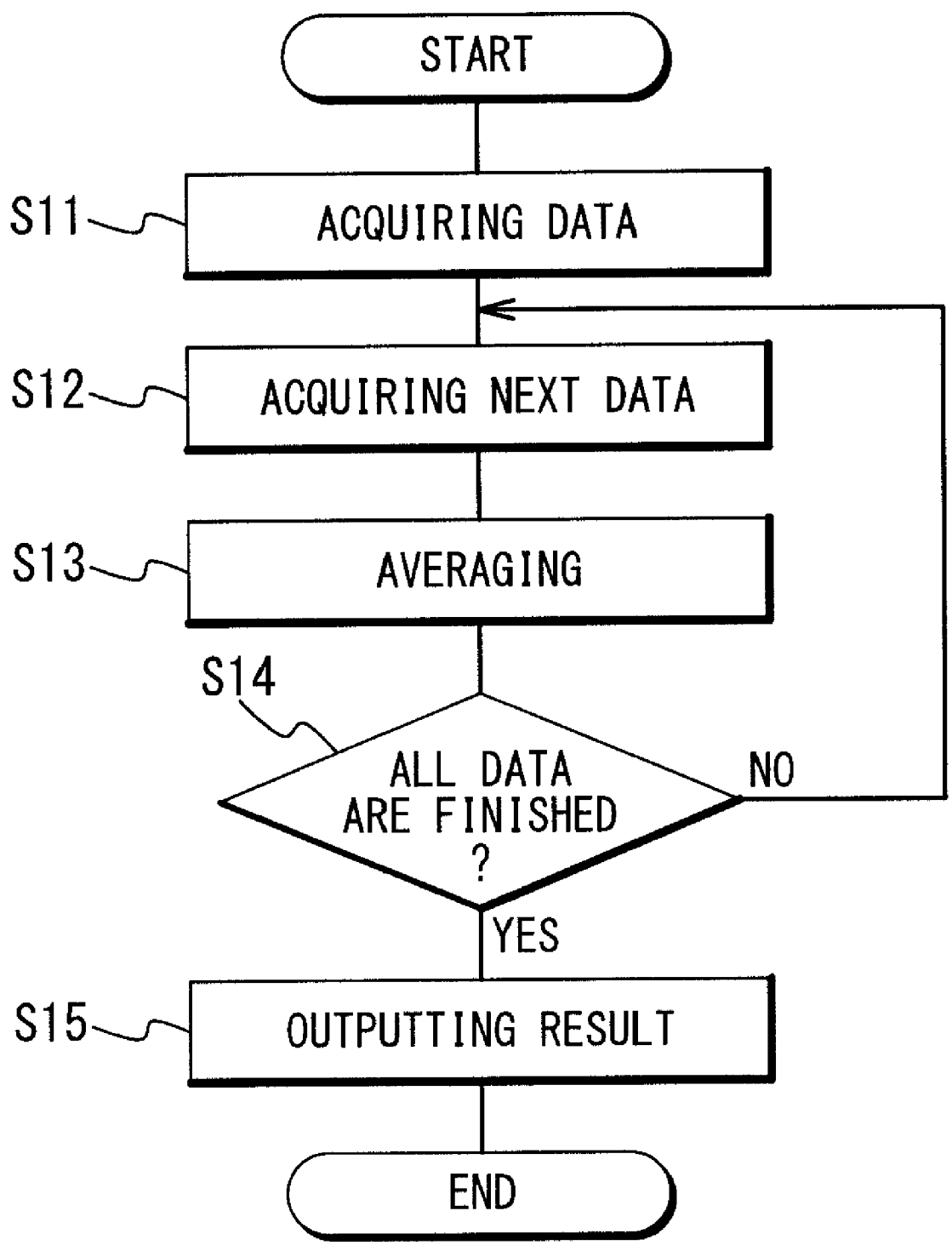
FIG. 18 is a flow chart showing an operation of an averaged signal detecting section.

FIG. 18 is a flow chart showing an operation of the averaged signal detecting section 701. The averaged signal is obtained by the averaged signal detecting section 701 which averages signals and noise supplied from individual electric field sensors 105 constituting the electric field sensor 705. For example, a specific process is shown below.

First, a signal (data) including noise from one electric field sensor 105 is acquired from the spectrum analyzer (Step S11). Next, a signal (next data) including noise from another electric field sensor 105 is acquired from the spectrum analyzer (Step S12). The signal including noise from the one electric field sensor 105 and the signal including noise from the other electric field sensor 105 are averaged to obtain an averaged signal (Step S13). Here, it is determined whether or not signals from all electric field sensors 105 are averaged (Step S14). When the signals from all of the electric field sensors 105 are not averaged (Step S14: NO), the procedure returns to the step S12. Then, a signal including noise from another next electric field sensor 105 is acquired (Step S12), and the signal and the averaged signal at the step S13 are further averaged to obtain an averaged signal (Step S13). Such processing is sequentially performed with respect to all of the electric field sensors 105 included in the electric field sensor 705. Averaging means an operation of superimposing a plurality of signals and dividing the superimposed signals by the number of signals. When the signals from all the electric field sensors 105 are averaged (Step S14: YES), a calculation result is outputted. Averaging means an operation of superimposing a plurality of signals and dividing the superimposed signals by the number of signals.

Other configurations, operations and manufacturing methods are the same as those in the first exemplary embodiment.

Figure 9:
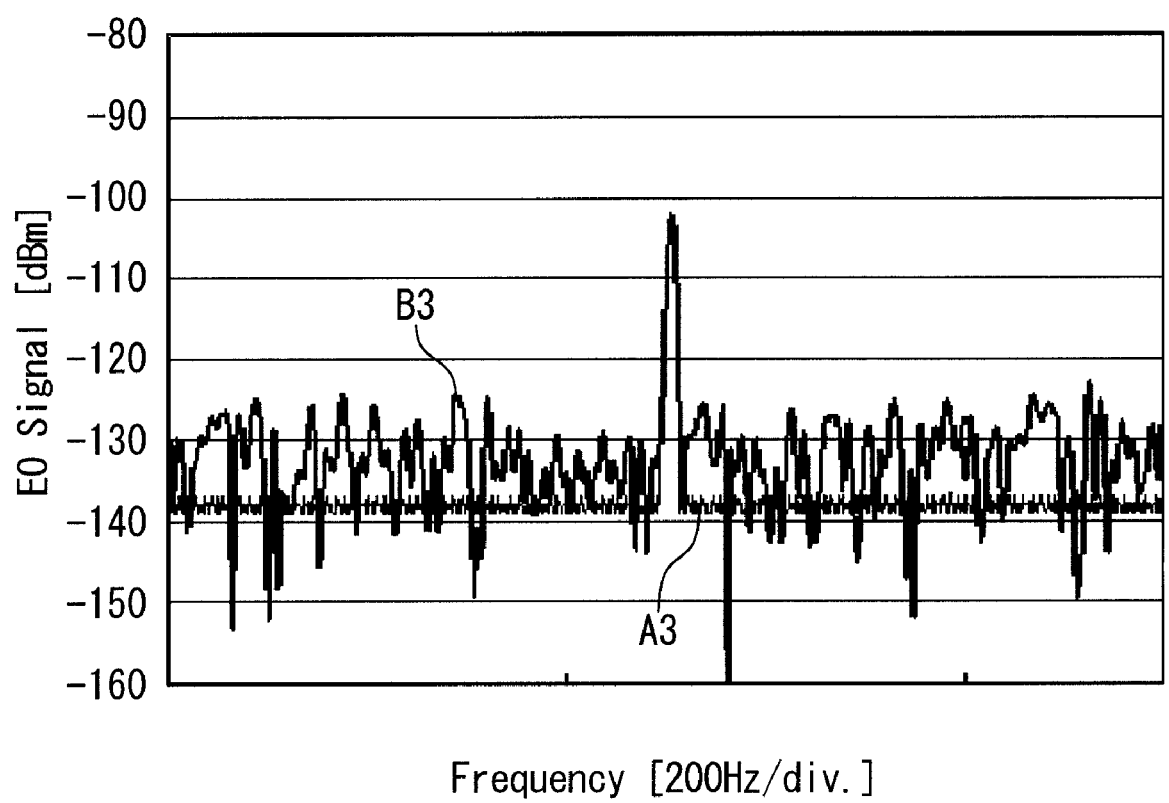
FIG. 9 is a graph showing detection results of electric signals in the electric field sensor in the present invention and the conventional electric field sensor.

FIG. 9 is a graph showing detection results of electric signals in the electric field sensor 705 in the present invention and the conventional electric field sensor. A horizontal axis represents frequency and a vertical axis represents an electric signal corresponding to the electric field intensity.

A curve A3 shows a result of detection of an averaged signal among the individual electric field sensors 105, in a process of incorporating the electric field sensor 705 of the present invention into the electric field measuring system 120 and sequentially switching the electric field sensor 105 into which a laser beam enters for continuous measurement. A curve B3 shows a detection result of the electric signal by the conventional electric field sensor. A microstrip line having a single linear strip conductor is used as a circuit under test, and each sensor is fixed at a position above the line by 10 μm. A signal of 10 MHz and 15 dBm is applied to the line. Employing the electric field sensor 705 of the present invention reduces noise, thereby improving the S/N ratio as compared to the conventional electric field sensor and realizing improvement in sensitivity.

The electric field sensor in the present exemplary embodiment is constituted by tying a plurality of electric field sensors in the first exemplary embodiment in a bundle. However, the electric field sensors in the second exemplary embodiment may be tied in a bundle. The tied electric field sensors are not limited to the electric field sensors in the first and the second exemplary embodiments. For example, electric field sensors, in each of which an electro-optic layer is formed on a flat end surface of an optical fiber, may be used.

According to the present invention, the electromagnetic field sensor and an electromagnetic field measuring system using the sensor, which are more compact, have higher spatial resolution and can be applied to a micro region of an LSI chip/package, can be achieved.

Fourth Exemplary Embodiment

A fourth exemplary embodiment of the electromagnetic field sensor and the electromagnetic field measuring system using the sensor according to the present invention will be described referring to the attached drawings. Here, a magnetic field sensor as an electromagnetic field sensor and a magnetic field measuring system using the magnetic field sensor as the electromagnetic field measuring system will be described.

Figure 10A:
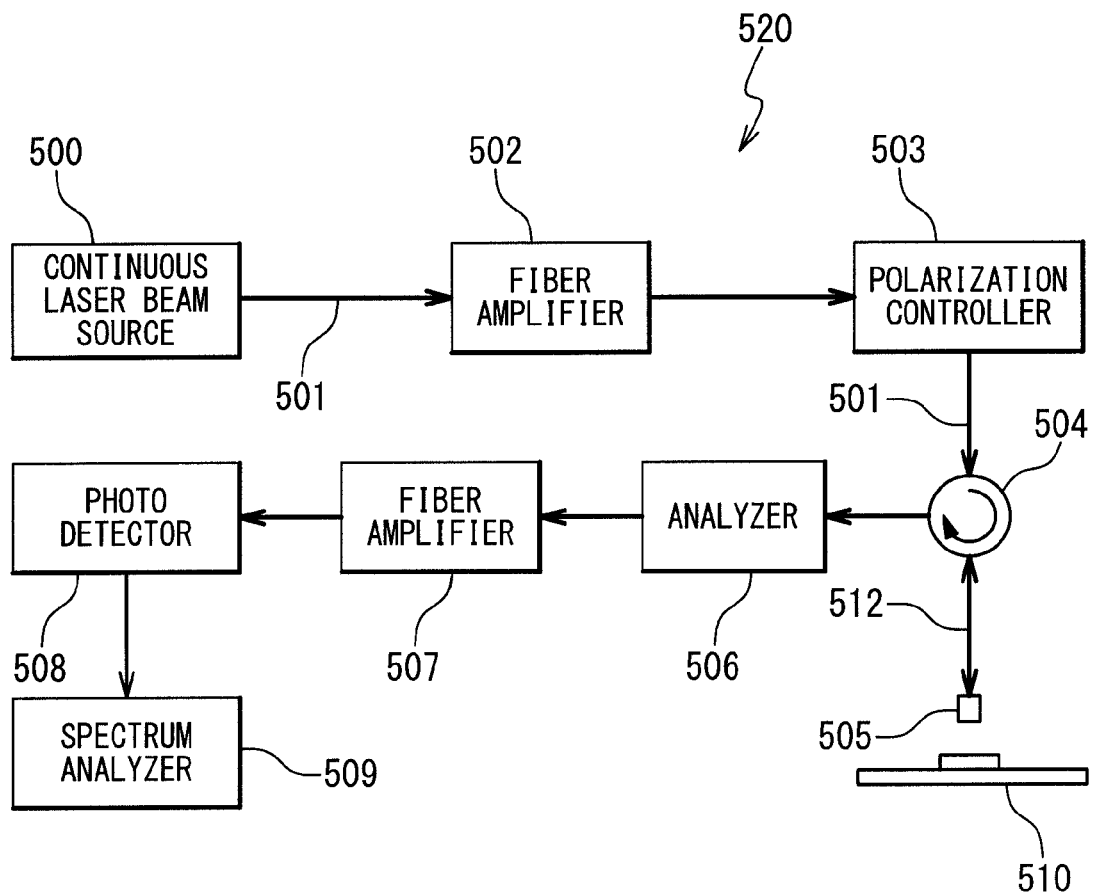
FIG. 10A is a block diagram showing configuration of a magnetic field measuring system using a magnetic field sensor in a fourth exemplary embodiment according to the present invention.
Figure 10B:
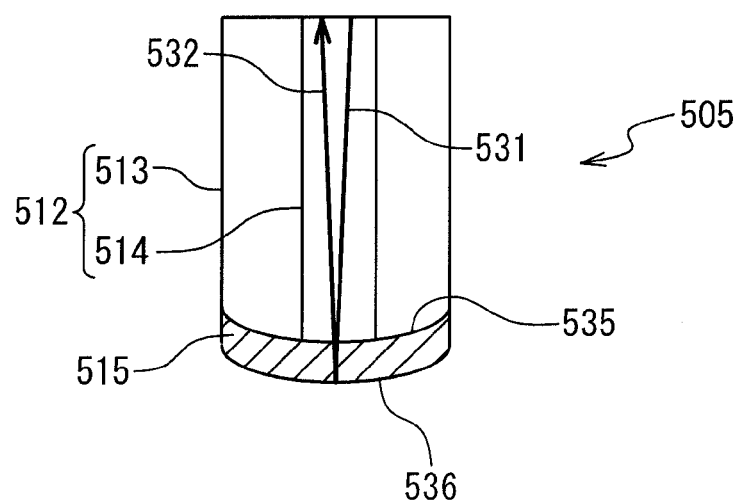
FIG. 10B is a sectional view of the magnetic field sensor in the fourth exemplary embodiment according to the present invention.

FIG. 10A is a block diagram showing a configuration of a magnetic measuring system using the magnetic field sensor in the fourth exemplary embodiment according to the present invention. FIG. 10B is a sectional view of the magnetic field sensor in the fourth exemplary embodiment according to the present invention. The magnetic field measuring system 520 includes, as shown in FIG. 10A, an optical fiber 501, a continuous laser beam source 500, a fiber amplifier 502, a polarization controller 503, an optical circulator 504, a magnetic field sensor 505, an analyzer 506, a fiber amplifier 507, a photo detector 508 and a spectrum analyzer 509.

The optical fiber 501, the optical fiber 512, the continuous laser beam source 500, the fiber amplifier 502, the polarization controller 503, the optical circulator 504, the analyzer 506, the fiber amplifier 507, the photo detector 508 and the spectrum analyzer 509 are the same as the optical fiber 101, the optical fiber 112, the continuous laser beam source 100, the fiber amplifier 102, the polarization controller 103, the optical circulator 104, the analyzer 106, the fiber amplifier 107, the photo detector 108, the spectrum analyzer 109 in the first exemplary embodiment, respectively.

The magnetic field sensor 505 includes, as shown in FIG. 10B, an optical fiber 512 and a magneto-optic layer 515. The optical fiber 512 includes a clad layer 513 and a core layer 514. One end portion of the optical fiber 512 is connected to the optical circulator 504. An end surface 535 of the other end portion is processed to a convex curved surface by polishing. The magneto-optic layer 515 as a minute magnetic detecting element is formed directly on the end surface 535. An outer surface 536 of the magneto-optic layer 515 is directed to an object to be measured. Since the magneto-optic layer 515 is formed to have the convex curved surface, light is condensed on the curved surface. As a result, the volume of the sensor beam is preferably reduced, thereby improving resolution in comparison to conventional.

Next, an operation of the electric field measuring system in the fourth exemplary embodiment according to the present invention will be described. The continuous laser beam source 500 emits a laser beam. The fiber amplifier 502 amplifies the laser beam. The polarization controller 503 controls a polarization plane of the laser beam. The optical circulator 504 emits the laser beam to the magnetic field sensor 505. Laser beam (531) propagating through the core layer 514 of the optical fiber 512 is reflected by a bottom surface of the magneto-optic layer 515 with a difference between a refraction index of the magneto-optic layer 115 and that of air. At this time, the refraction index of the magneto-optic layer 515 varies depending on magnetic field generated from the circuit board 510. With this change, a polarization state of the laser beam propagating in the magneto-optic layer 515 is modulated based on an intensity of the external magnetic field. The optical circulator 504 returns the modulated and reflected laser beam (532) to the optical fiber 501 again. The analyzer 506 converts the laser beam into intensity modulated light. The fiber amplifier 507 amplifies the converted laser beam. The photo detector 508 converts the amplified laser beam into an electric signal. The spectrum analyzer 509 detects the electric signal. A peak of the electric signal detected by the spectrum analyzer 509 corresponds to a signal caused by the external magnetic field. According to the principles of this system, the intensity of the signal varies depending on the intensity of the external magnetic field. For this reason, magnetic field distribution can be obtained by changing the location of the magnetic field sensor 505 on the circuit board 510.

The spatial resolution of the magnetic field sensor is determined by the volume of the sensor beam (laser beam) propagating in the magneto-optic layer 515. As the volume of the sensor beam (laser beam) is smaller, the spatial resolution becomes higher.

Since vertical resolution is determined by a thickness of the magneto-optic layer 515, it is preferred that the magneto-optic layer 515 is thin. Conventionally, the layer is made thin by processing a bulk magneto-optic member, and then, bonded to the front end of the optical fiber. The process limitation for making the bulk member thin by processing is approximately 10 μm. For this reason, it is difficult to improve the vertical resolution. According to the present invention, however, the magneto-optic layer 515 as a thin film is formed directly on the front end of the optical fiber 512 which is processed to the convex curved surface by polishing. Accordingly, the magneto-optic layer 515 can be made thinner without being limited by the process limitation of 10 μm. Thus, the vertical resolution can be improved. Preferably, the thickness of the magneto-optic layer 515 is equal to or thicker than 1 μm (micrometer), and equal to or thinner than 8 μm (micrometer), for example. When the thickness of the magneto-optic layer 515 is thinner than 1 μm, a S/N ratio large enough to measure magnetic field cannot be obtained. When the thickness of the magneto-optic layer 115 is thinner than 8 μm, preferable high resolution can be obtained.

Since horizontal resolution is determined by the diameter of the laser beam propagating in the magneto-optic layer 515, it is preferred to narrow down the optical diameter. Conventionally, as described above, the optical diameter cannot be sufficiently narrowed down due to an existence of the adhesive layer. According to the present invention, as described above, since the magneto-optic layer 515 as a thin film is formed directly on the front end of the optical fiber 512, an adhesive layer is unnecessary. Thus, the diameter of the laser beam can be narrowed down without being interfered by the adhesive layer. Therefore, the horizontal resolution can be improved.

As described above, the spatial resolution of the magnetic field sensor 505 can be increased by improving the vertical and horizontal resolution.

Next, a manufacturing method of the magnetic field sensor in the fourth exemplary embodiment according to the present invention will be described.

The magneto-optic layer 515 is formed by using an aerosol deposition method. In the aerosol deposition method, first, an aerosol generator is filled with ultrafine particles. Next, carrier gas (e.g., nitrogen, air) is introduced into the aerosol generator to produce aerosol in which the ultrafine particles are uniformly dispersed. The aerosol is supplied to a film forming chamber, injected from a nozzle to a substrate and is accumulated thereon. Thus, a desired film is formed. Since the ultrafine particles (brittle material) reach the substrate with mechanical impact force, the particles are accumulated while being crushed on the substrate.

FIG. 17 is a flow chart showing a manufacturing method of the magnetic field sensor in an exemplary embodiment of the present invention.

First, a substrate used for film formation in the aerosol deposition method is prepared (Step S01). The optical fiber 512 is used as the substrate. A film forming surface is an end surface 535 on the end portion of the optical fiber 512. The end portion of the optical fiber 512 is processed to a convex curved surface by polishing. Next, a film is formed by using the aerosol deposition method (Step S02). Film forming conditions of the magneto-optic layer 515 according to the aerosol deposition method are as follows. The thickness of the magneto-optic layer 515 is set to 4000 nm. Bi-substituted YIG (yttrium-iron-garnet) is used as raw powder and oxygen is used as the carrier gas. An incident angle of the nozzle to the substrate (the end surface 535 of the optical fiber 512) is set to 30 degrees, a gas flow rate is set to 8 liters/minute, a distance between the nozzle and the substrate is set to 5 mm, a film forming rate is set to 1.0 μm/minute and vibration frequency of a vibration generator is set to 250 rpm.

Then, the following processing including heat treatment is carried out (Step S03). That is, first, following film formation, the magneto-optic layer 515 is heated in atmosphere at 600° C. for 15 minutes. The magneto-optic effect of the magneto-optic layer 515 appears by the heat treatment. A Faraday rotational angle is 7 deg/mm. After heat treatment, to remove irregularity of the surface 536 of the magneto-optic layer 515, the layer is polished to have a thickness of 3600 nm for planarization.

Through the above-mentioned manufacturing method, the magnetic field sensor 505 is formed.

In the above-mentioned description, Bi-substituted YIG is used to form the magneto-optic layer 515. However, the composition is not limited to Bi-substituted YIG and, for example, Ce may be added. In addition to a YIG material, materials with high magneto-optic effect such as ferrite having a spinel structure or a hexagonal structure can be also used. Furthermore, a ferromagnetic ultrathin layer including iron, nickel or cobalt can be used as the magneto-optic layer.

One of features of the present invention is that the film of the magneto-optic layer 515 is formed by using the aerosol deposition method. The reason is as follows. An object of the present invention is to provide a magnetic field sensor with high resolution. Thus, it is preferred that the magneto-optic layer 515 as a thin film is formed directly on the front end of the processed optical fiber. To obtain a S/N ratio large enough to measure magnetic field, the thickness of the layer is preferably 1 μm or more. It is not possible to form a ferroelectric transparent film of 1 μm on plastics, resin including polymers or a dielectric with an arbitrary composition by using a sputtering method or a sol-gel method. But it is possible to form such thin film only by using the aerosol deposition method.

Figure 11:
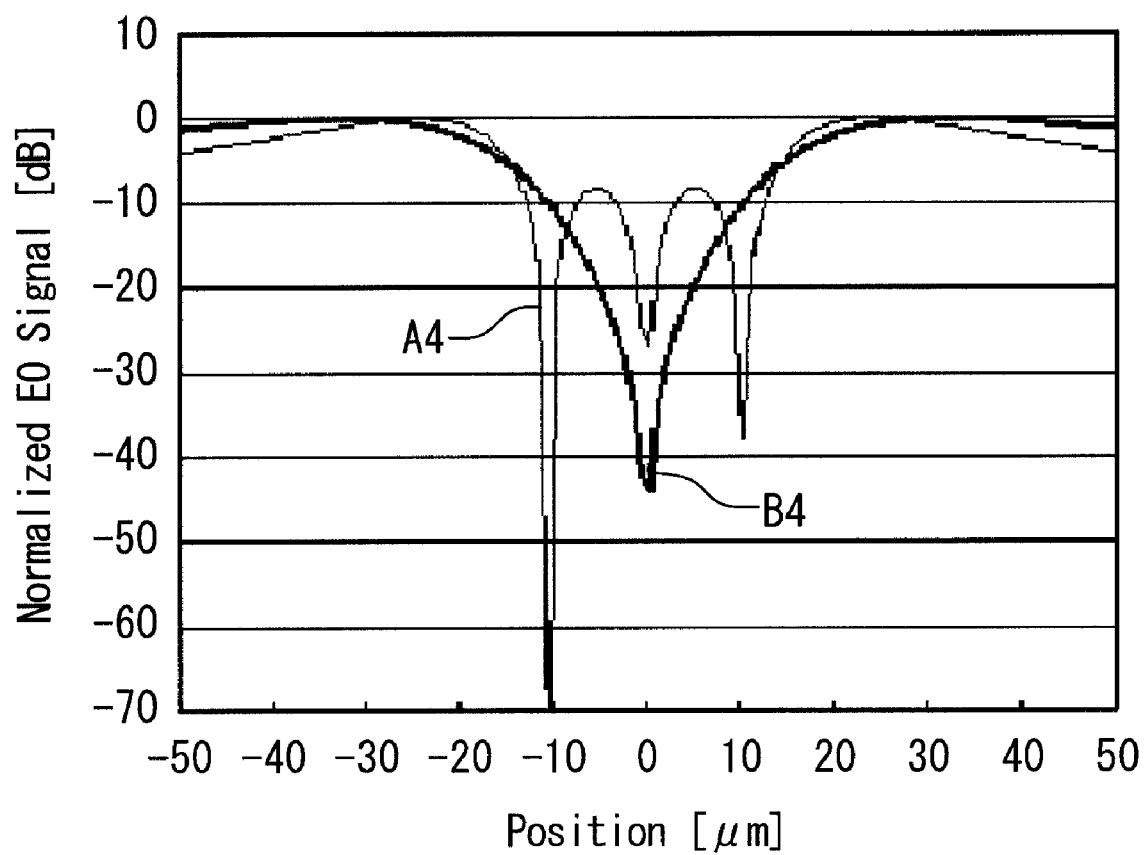
FIG. 11 is a graph showing an example of magnetic field distribution measured by using the electric field sensor in the present invention and the conventional electric field sensor.

FIG. 11 is a graph showing an example of magnetic field distribution measured by using the magnetic field sensor of the present invention and the conventional electric field sensor. A curve A4 shows a case of using the magnetic field sensor of the present invention and a curve B4 shows a case of using the conventional magnetic field sensor. A horizontal axis represents a position and a vertical axis represents an electric signal corresponding to a magnetic field intensity. The magnetic field distribution is measured above a three-meander line with line width/interval of 5 μm. A signal of 10 MHz and 15 dBm is applied to the meander line. The magnetic field distribution is obtained when the magnetic field sensor is placed at the position above the meander line by 10 μm and scanned at intervals of 1 μm in the direction of crossing the meander line. In a case of the conventional magnetic field sensor, a peak of magnetic field to be observed between adjacent lines cannot be observed (curve B4). On the contrary, in a case of the magnetic field sensor of the present invention, a peak of magnetic field is clearly observed (curve A4). This result reveals that the magnetic field sensor of the present invention has a higher spatial resolution than the conventional magnetic field sensor.

According to the present invention, the electromagnetic field sensor and an electromagnetic field measuring system using the sensor, which are more compact, have higher spatial resolution and can be applied to a micro region of the LSI chip/package, can be achieved.

Fifth Exemplary Embodiment

A fifth exemplary embodiment of the electromagnetic field sensor and the electromagnetic field measuring system using the sensor according to the present invention will be described referring to the attached drawings. Here, a magnetic field sensor as an electromagnetic field sensor and a magnetic field measuring system using the magnetic field sensor as the electromagnetic field measuring system will be described.

In the present exemplary embodiment, the magnetic field measuring system is the basically same as the magnetic field measuring system 520 in the fourth exemplary embodiment. However, a configuration of a magnetic field sensor 605 of magnetic field measuring system in the present exemplary embodiment is different from that of the magnetic field sensor 505 in the fourth exemplary embodiment.

Figure 12:
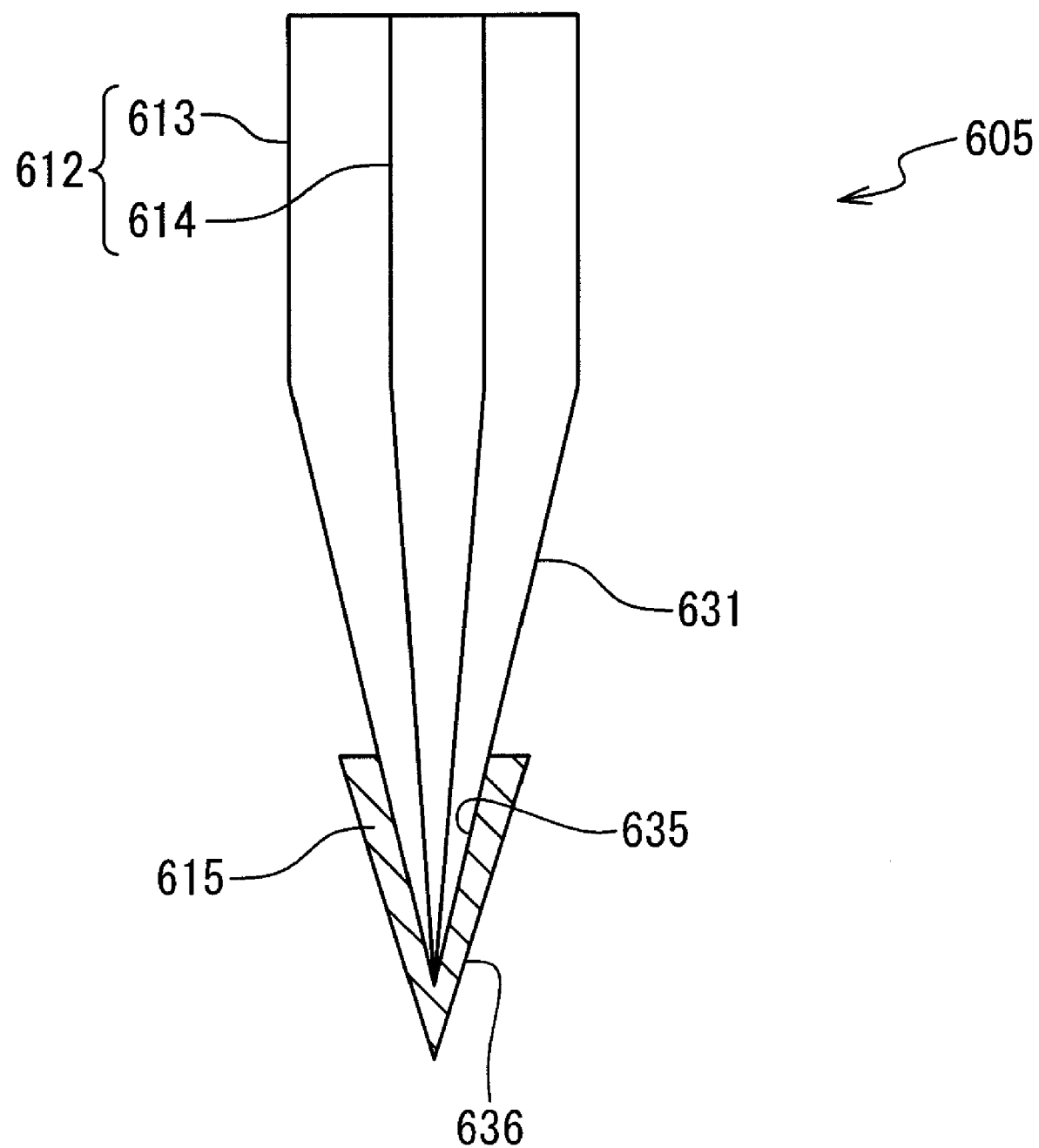
FIG. 12 is a sectional view showing a configuration of a magnetic field sensor in a fifth exemplary embodiment according to the present invention.

FIG. 12 is a sectional view showing a configuration of the magnetic field sensor in the fifth exemplary embodiment according to the present invention. The magnetic field sensor 605 includes an optical fiber 612 and a magneto-optic layer 615. The optical fiber 612 includes a clad layer 613 and a core layer 614. One end portion of the optical fiber 612 is connected to the optical circulator 504. The other end portion forms a cone 631. However, the cone does not necessarily have an accurate conical shape, and may have substantially conical shape which can be formed when the end portion is extended by a pulling operation during heating. The magneto-optic layer 615 as a minute magnetic detecting element is formed directly on a side surface (curved surface) 635 of the front end portion of the cone 631. An outer surface 636 of the magneto-optic layer 615 is directed to an object to be measured. Other configuration of the magnetic field sensor 605 is the same as that in the fourth exemplary embodiment.

Next, an operation of the magnetic field measuring system in the fifth exemplary embodiment of the present invention is the same as that in the fourth exemplary embodiment except that the magnetic field sensor 605 is used.

Also in this case, the same effect as that in the fourth exemplary embodiment can be obtained. Moreover, the magnetic field sensor 605 in the present exemplary embodiment can further collects the laser beam than the magnetic field sensor 505 in the fourth exemplary embodiment which is produced by forming the magneto-optic layer 515 on the front end of the optical fiber 512 processed to the convex curved surface 535. Thus, the magnetic field sensor 605 has higher spatial resolution than the magnetic field sensor 505 in the fourth exemplary embodiment.

The shape of the end portion of the optical fiber is not limited to the shape as in the fourth exemplary embodiment and the present exemplary embodiment. Preferably, the end portion is shaped like a front end portion of the optical fiber 612 so that the laser beam reflected by the end portion is easy to be collected. This can increase the laser beam contributing to measurement and improve sensitivity of the magnetic field sensor and the S/N ratio.

Next, a manufacturing method of the magnetic field sensor in the fifth exemplary embodiment according to the present invention is the same as that in the fourth exemplary embodiment shown in FIG. 17 except that the optical fiber 612 is used. Here, an end portion of the optical fiber 612 as the substrate is processed as follows. First, the end portion is extended by a pulling operation while being heated and cut at a proper position. Then, the front end portion is keenly sharpened. Also in this case, the same effect as that in the fourth exemplary embodiment can be obtained.

Figure 13:
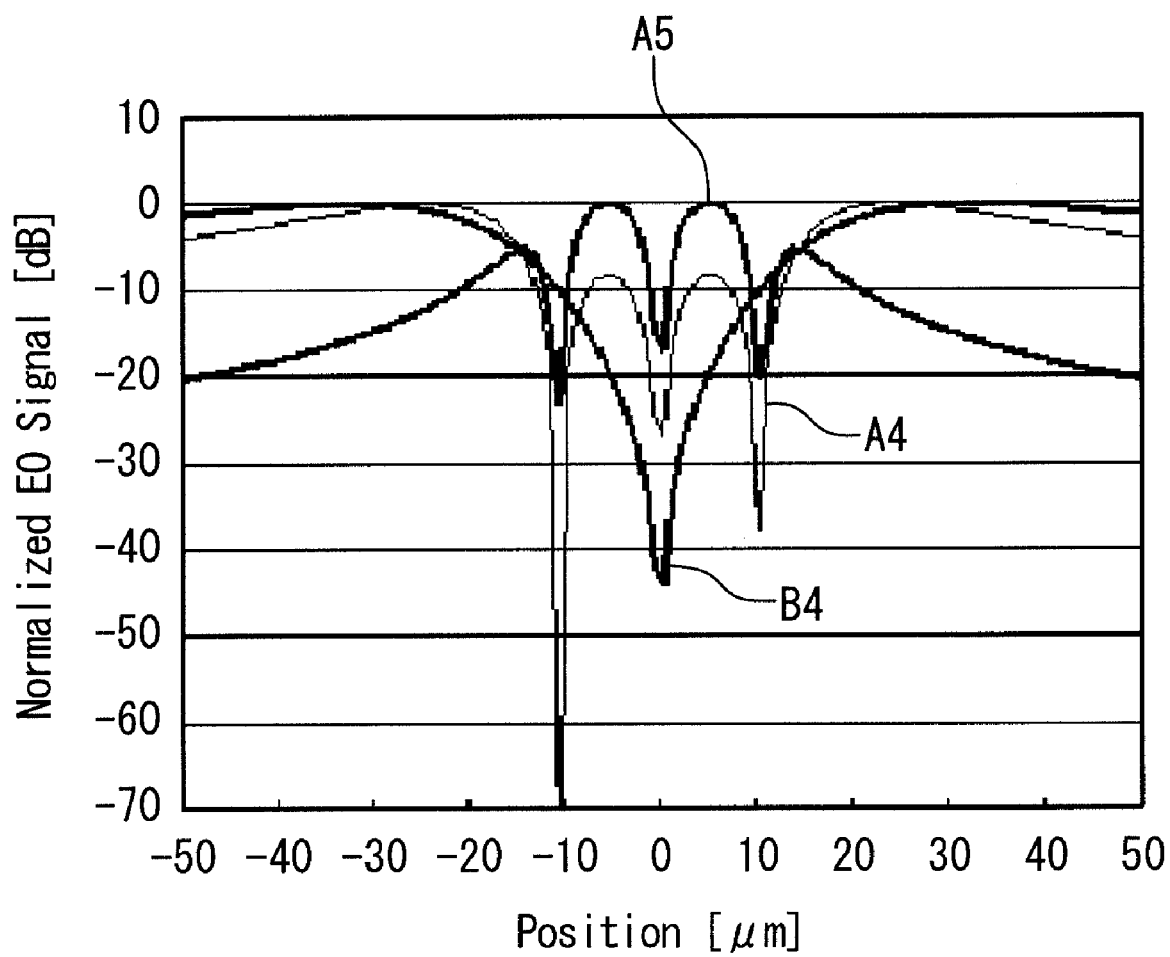
FIG. 13 is a graph showing an example of magnetic field distribution measured by using the electric field sensor in the present invention and the conventional electric field sensor.

FIG. 13 is a graph showing an example of magnetic field distribution measured by using the magnetic field sensor of the present invention and the conventional electric field sensor. A curve A5 shows the case of using the magnetic field sensor of the present invention, a curve B4 shows the case of using the conventional magnetic field sensor and a curve A4 is the same as the curve shown in FIG. 11. A horizontal axis represents a position and a vertical axis represents an electric signal corresponding to the magnetic field intensity. The magnetic field distribution is measured above a three-meander line with line width/interval of 5 μm. A signal of 10 MHz and 15 dBm is applied to the meander line. The magnetic field distribution is obtained when the magnetic field sensor is placed at the position above the meander line by 10 μm and scanned at intervals of 1 μm in the direction of crossing the meander line.

In the case of the conventional magnetic field sensor, a peak of magnetic field to be observed between adjacent lines cannot be observed (curve B2). On the contrary, in the case of the magnetic field sensor of the present invention, a peak of magnetic field is clearly observed (curve A5). This result reveals that the magnetic field sensor of the present invention has a higher spatial resolution than the conventional magnetic field sensor. As compared with a case of using the magnetic field sensor 505 in the fourth exemplary embodiment (curve A4), the relative intensity of peaks of magnetic field at two points in the central part is higher. FIG. 13 reveals that the magnetic field sensor 605 in the present exemplary embodiment has higher spatial resolution than the magnetic field sensor 505 in the fourth exemplary embodiment.

Due to the same effect as that described in the exemplary embodiment of the electric field sensor of the present invention, by forming the dielectric multilayer film reflective layer above the magneto-optic layer or forming the dielectric multilayer film reflective layers above and below the magneto-optic layer, the sensitivity of the magnetic field sensor of the present invention can be improved.

According to the present invention, the electromagnetic field sensor and an electromagnetic field measuring system using the sensor, which are more compact, have higher spatial resolution and can be applied to a micro region of an LSI chip/package, can be achieved.

Sixth Exemplary Embodiment

A sixth exemplary embodiment of the electromagnetic field sensor and the electromagnetic field measuring system using the sensor according to the present invention will be described referring to the attached drawings. Here, a magnetic field sensor as an electromagnetic field sensor and a magnetic field measuring system using the magnetic field sensor as the electromagnetic field measuring system will be described.

The magnetic field measuring system in the present exemplary embodiment is the basically same as the magnetic field measuring system 520 in the fourth exemplary embodiment. However, the present exemplary embodiment is different from the fourth exemplary embodiment in that a plurality of magnetic field sensors 505 tied in a bundle performs magnetic field measurement at a plurality of points at a time, not magnetic field measurement at one point at a time.

Figure 14:
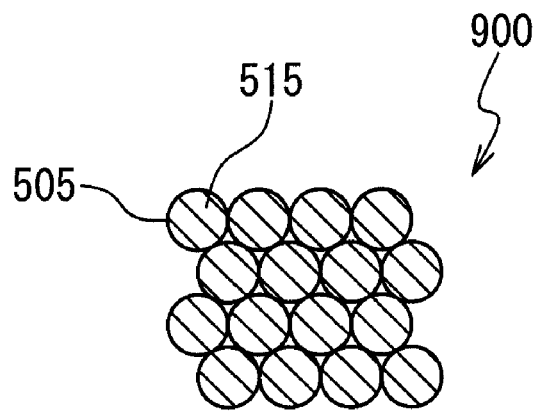
FIG. 14 is a view showing an example of a magnetic field sensor 805 formed by tying a plurality of magnetic field sensors 505 in the first exemplary embodiment.

In a method of magnetic field measurement at a plurality of points, for example, a plurality of magnetic field measuring systems 520 are prepared and a plurality of magnetic field sensors 505 belonging to them are tied in a bundle. FIG. 14 is a view showing an example of a magnetic field sensor 805 formed by tying the plurality of magnetic field sensors 505 in the fourth exemplary embodiment. FIG. 14 is a view when viewed from the side of the magneto-optic layer 515. In a magnetic field sensor 900, one-dimensionally aligned magnetic field sensors 505 are tied so as to be two-dimensionally closest-packed (in a staggered or honeycomb shape). Data sent from the spectrum analyzer 509 of each magnetic field measuring system 520 are processed by one computer (not shown).

Since a magnetic field intensity is measured by using the magnetic field sensor 900 formed of the magnetic field sensors 505 tied in a bundle, two-dimensional distribution of the magnetic field intensity with high resolution can be obtained without scanning in a much shorter time period than conventional.

The magnetic field sensor may be formed of only a plurality of magnetic field sensors 505 aligned in a line in one-dimensional way. In this case, by scanning the sensor in a direction perpendicular to the tying direction at small intervals, two-dimensional distribution of the magnetic field intensity with high resolution can be obtained in a shorter time period than conventional.

One magnetic field measuring system 520 may use the magnetic field sensor 900 as a magnetic field sensor. In this case, a laser switching section (not shown) for continuously switching the magnetic field sensor 505 in the magnetic field sensor 900 into which the laser beam enters is provided between optical circulator 504 and the magnetic field sensor 900. In this manner, one magnetic field measuring system 520 can continuously measure two-dimensional distribution of the electric field intensity with high resolution.

When the magnetic field sensor 900 formed of a plurality of optical fibers tied in a bundle is used, by detecting an averaged signal among individual magnetic field sensors 505 constituting the magnetic field sensor 900, noise can be averaged. Thus, the S/N ratio can be increased. The averaged signal is detected by a program in an information processor built in the spectrum analyzer 109 or an information processor (described later) connected to the spectrum analyzer 109. The method of detecting the averaged signal is described in the third exemplary embodiment (FIGS. 16 and 18).

Other configurations, operations and manufacturing methods are the same as those in the fourth exemplary embodiment.

The magnetic field sensor in the present exemplary embodiment is constituted by tying a plurality of magnetic field sensors in the fourth exemplary embodiment. However, the tied magnetic field sensors in a bundle may be the magnetic field sensors of the magnetic field measuring system in the fifth exemplary embodiment. The tied magnetic field sensors in a bundle are not limited to the magnetic field sensors of the magnetic field measuring system in the fourth and fifth exemplary embodiments. For example, magnetic field sensors formed on an end surface of the optical fiber with a flat magneto-optic layer may be used.

According to the present invention, the electromagnetic field sensor and an electromagnetic field measuring system using the sensor, which are more compact, have higher spatial resolution and can be applied to a micro region of an LSI chip/package, can be achieved.

Seventh Exemplary Embodiment

A seventh exemplary embodiment of the electromagnetic field sensor and the electromagnetic field measuring system using the sensor according to the present invention will be described referring to the attached drawings. Here, an electric field sensor and a magnetic field sensor as an electromagnetic field sensor and an electric field measuring system using the electric field sensor and a magnetic field sensor as the electromagnetic field measuring system will be described.

The electromagnetic field measuring system in the present exemplary embodiment is the basically same as the electric field measuring system 120 in the first exemplary embodiment or the magnetic field measuring system 520 in the fourth exemplary embodiment. However, this electromagnetic field measuring system is different from the electric field measuring system 120 in the first exemplary embodiment or the magnetic field measuring system 520 in the fourth exemplary embodiment in that a plurality of electric field sensors 105 and magnetic field sensors 505 tied in a bundle performs electric field measurement and magnetic field measurement at a plurality of points at a time, not electric field measurement and magnetic field measurement at one point at a time.

Figure 15:
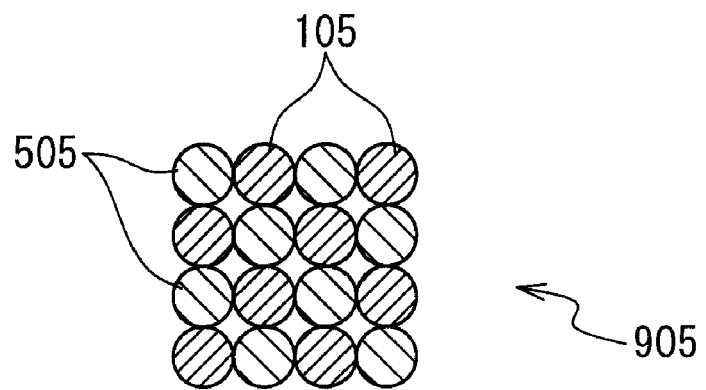
FIG. 15 is a view showing an example of an electromagnetic field sensor 905 formed by tying a plurality of electric field sensors 105 and magnetic field sensors 505 in a bundle.

In a method of electric field measurement and magnetic field measurement at a plurality of points, for example, a plurality of electric field measuring systems 120 and magnetic field measuring systems 520 are prepared and a plurality of electric field sensors 105 and magnetic field sensors 505 belonging to them are tied in a bundle. FIG. 15 is a view showing an example of an electromagnetic field sensor 905 formed by tying a plurality of electric field sensors 105 and a plurality of magnetic field sensors 505 in a bundle. FIG. 15 is a view when viewed from the side of the electro-optic layer 115 and the magneto-optic layer 515. In the electromagnetic field sensor 905, a plurality of electric field sensors 105 and magnetic field sensors 505 alternately aligned in one-dimensional way are tied so as to be two-dimensionally closest-packed (in a staggered or honeycomb shape). Data sent from the spectrum analyzer 109 of each electric field measuring system 120 and the spectrum analyzer 509 of each magnetic field measuring system 520 are processed by one computer (not shown).

Since the electric field intensity and the magnetic field intensity are measured by using the electromagnetic field sensor 905 formed of the electric field sensors 105 and the magnetic field sensors 505 tied in a bundle, two-dimensional distribution of the electric field intensity and the magnetic field intensity with high resolution (electromagnetic field map with high spatial resolution) can be obtained without scanning in a much shorter time period than conventional.

The electromagnetic field sensor 905 may be formed of only the plurality of electric field sensors 105 and magnetic field sensors 505 aligned in a line in one-dimensional way. In this case, by scanning the sensor in the direction perpendicular to the tying direction at small intervals, two-dimensional distribution of the electric field intensity and the magnetic field intensity with high resolution (electromagnetic field map with high spatial resolution) can be obtained in a shorter time period than conventional.

One magnetic field measuring system 520 may use the plurality of magnetic field sensors 505 of the electromagnetic field sensor 905 as magnetic field sensors and one electric field measuring system 120 may use the plurality of electric field sensors 105 of the electromagnetic field sensor 905 as electric field sensors. In this case, a laser switching section (not shown) for continuously switching the electric field sensor 105 or the magnetic field sensor 505 into which the laser beam enters is provided between optical circulator 104 and the plurality of electric field sensor 105 of the electromagnetic field sensor 905, the optical circulator 504 and the plurality of magnetic field sensors 505 of the electromagnetic field sensor 905. In this manner, one magnetic field measuring system 520 and one electric field measuring system 120 can continuously measure two-dimensional distribution of an electromagnetic field intensity with high resolution.

Furthermore, one electromagnetic field measuring system (the magnetic field measuring system 520 or the electric field measuring system 120) may use the plurality of electric field sensors 105 and the magnetic field sensor 505 of the electromagnetic field sensor 905. In this case, a laser switching section (not shown) for continuously switching electric field sensor 105 and the magnetic field sensor 505 into which the laser beam enters is provided between the optical circulator 104 or the optical circulator 504 and the electromagnetic field sensor 905. In this manner, one electromagnetic field measuring system can continuously measure two-dimensional distribution of the electromagnetic field intensity with high resolution.

When the electromagnetic field sensor 905 formed of a plurality of optical fibers tied in a bundle is used, by detecting an averaged signal among individual electric field sensors 105 and an averaged signal among individual magnetic field sensors 505 forming the magnetic field sensor 905, noise can be averaged. Thus, the S/N ratio of each of the electric field intensity and the magnetic field intensity can be increased. The averaged signal is detected by a program in the spectrum analyzer 109 or a computer connected to the spectrum analyzer 109 (not shown). The method of detecting the averaged signal is described in the third exemplary embodiment.

Other configurations, operations and manufacturing methods are the same as those in the first and fourth exemplary embodiments.

The electromagnetic field sensor in the present exemplary embodiment is formed by tying a plurality of electric field sensors in the first exemplary embodiment and a plurality of magnetic field sensors in the fourth exemplary embodiment in a bundle. However, the tied electric field sensor may be the electric field sensors in the second exemplary embodiment and the tied magnetic field sensors may be the magnetic field sensors in the fifth exemplary embodiment. The tied electric field sensors are not limited to the electric field sensors in the first and second exemplary embodiments. Similarly, the tied magnetic field sensors are not limited to the magnetic field sensors in the fourth and fifth exemplary embodiments. For example, electric field sensors formed on the end surface of the optical fiber with a flat electro-optic layer may be used. Magnetic field sensors formed on the end surface of the optical fiber with a flat magneto-optic layer may be used.

According to the present invention, the electromagnetic field sensor and an electromagnetic field measuring system using the sensor, which are more compact, has higher spatial resolution and can be applied to a micro region of an LSI chip/package, can be achieved.

The invention claimed is:

1. An electromagnetic field sensor comprising:
an optical fiber; and
an optic layer configured to be provided on an end surface of an end portion of said optical fiber and reflect light entering through said optical fiber,
wherein said optic layer is directly formed by an aerosol deposition method on said end portion of said optical fiber,
wherein said optical fiber has said end portion with a substantially conical shape which is formed by extending said end portion, and
said optic layer is formed on a side surface of a front end of said substantial cone.

2. The electromagnetic field sensor according to claim 1, wherein said optic layer is a crystalline film directly formed on said end surface.

3. The electromagnetic field sensor according to claim 2, further comprising:
a dielectric layer configured to be provided on said optic layer.

4. The electromagnetic field sensor according to claim 1, wherein said optic layer includes an electro-optic layer.

5. The electromagnetic field sensor according to claim 1, wherein said optic layer includes a magneto-optic layer.

6. The electromagnetic field sensor according to claim 4, wherein said end surface is a convex shape.

7. The electromagnetic field sensor according to claim 3, further comprising:
a dielectric layer provided between said optic layer and said end surface,
wherein said optic layer is a crystalline film directly formed on said dielectric layer.

8. The electromagnetic field sensor according to claim 1, wherein a thickness of said optic layer is equal to or thicker than 1 μm and equal to or thinner than 8 μm.

9. The electromagnetic field sensor according to claim 1, further comprising:
a plurality of optical fibers each having said optic layer, including said optical fiber,
wherein said plurality of optical fibers is tied in a bundle.

10. The electromagnetic field sensor according to claim 9, wherein said plurality of optical fibers is tied in a bundle in one-dimensional way.

11. The electromagnetic field sensor according to claim 9, wherein said plurality of optical fibers is tied in a bundle in two-dimensional closest-packed way.

12. An electromagnetic field sensor comprising:
a plurality of electric field sensors configured to detect electric fields; and
a plurality of magnetic field sensors configured to detect magnetic fields,
wherein said plurality of electric field sensors and said plurality of magnetic field sensors are tied in a bundle,
wherein each of said plurality of electric field sensors includes:
an first optical fiber, and
an first optic layer configured to be provided on an end surface of an end portion of said first optical fiber and reflect light entering through said first optical fiber,
wherein said first optic layer includes an electro-optic layer,
wherein said each of plurality of magnetic field sensors includes:
an second optical fiber, and
an second optic layer configured to be provided on an end surface of an end portion of said second optical fiber and reflect light entering through said second optical fiber,
wherein said second optic layer includes a magneto-optic layer,
wherein said first optic layer is directly formed by an aerosol deposition method on said end portion of said first optical fiber, and said second optic layer is directly formed by an aerosol deposition method on said end portion of said second optical fiber,
wherein said optical fiber has said end portion with a substantially conical shape formed by extending said end portion, and
said optic layer is formed on a side surface of a front end of said substantial cone.

13. The electromagnetic field sensor according to claim 12, wherein said optic layer is a crystalline film directly formed on said end surface.

14. The electromagnetic field sensor according to claim 13, further comprising:
a dielectric layer provided between said optic layer and said end surface,
wherein said optic layer is a crystalline film directly formed on said dielectric layer.

15. The electromagnetic field sensor according to claim 12, wherein each of said plurality of electric field sensors and each of said plurality of magnetic field sensors are alternately arranged and tied in a bundle.

16. An electromagnetic field measuring system comprising:
a laser beam source configured to emit light;
an electromagnetic field sensor configured to reflect said light by an end portion of an optical fiber; and
a detecting section configured to detect said reflected light,
wherein electromagnetic field sensor comprising:
an optical fiber; and
an optic layer configured to be provided on an end surface of an end portion of said optical fiber and reflect light entering through said optical fiber,
wherein said optic layer is directly formed by an aerosol deposition method on said end portion of said optical fiber,
wherein said optical fiber has said end portion with a substantially conical shape formed by extending said end portion, and
said optic layer is formed on a side surface of a front end of said substantial cone.

17. A manufacturing method of a electromagnetic field sensor, comprising:
(a) forming one of an electro-optic layer and a magneto-optic layer on an end surface of an end portion of an optical fiber as a sensor layer by an aerosol deposition method; and
(b) performing heat treatment to said sensor layer,
wherein said step (a) includes:
(a2) extending said end portion to form said end surface with the substantially conical shape.

18. The manufacturing method of a electromagnetic field sensor according to claim 17, wherein said step (a) includes:
(a1) polishing said end portion to form said end surface with a convex shape.

19. The electromagnetic field sensor according to claim 5, wherein said end surface is a convex shape.

* * * * *